United States Patent [19]
Inaba et al.

[11] Patent Number: 6,094,390
[45] Date of Patent: *Jul. 25, 2000

[54] SEMICONDUCTOR MEMORY DEVICE WITH COLUMN GATE AND EQUALIZER CIRCUITRY

[75] Inventors: Tsuneo Inaba; Shinichiro Shiratake, both of Yokohama; Kenji Tsuchida, Kawasaki, all of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/072,724

[22] Filed: May 6, 1998

[30] Foreign Application Priority Data

May 9, 1997 [JP] Japan .................................. 9-119639

[51] Int. Cl.$^7$ .................................................. G11C 7/00
[52] U.S. Cl. .................... 365/203; 365/149; 365/230.06; 257/296; 257/401
[58] Field of Search ................................. 365/203, 149, 365/230.06, 230.01, 189.01, 129; 257/296, 401

[56] References Cited

U.S. PATENT DOCUMENTS

| | | | |
|---|---|---|---|
| 4,853,897 | 8/1989 | Nogami et al. | 365/189.11 |
| 5,416,350 | 5/1995 | Watanabe | 257/330 |
| 5,528,542 | 6/1996 | Okamura | 365/205 |
| 5,579,256 | 11/1996 | Kajigaya et al. | 365/51 |

FOREIGN PATENT DOCUMENTS 7-135257  5/1995  Japan .

*Primary Examiner*—David Nelms
*Assistant Examiner*—Hoai V. Ho
*Attorney, Agent, or Firm*—Banner & Witcoff, Ltd.

[57] ABSTRACT

A semiconductor memory device with a semiconductor substrate and a plurality of element regions formed in the semiconductor is shown. The semiconductor memory device further includes at least one column gate and at least one equalizer in which they are formed as a set in at least one of the element regions.

33 Claims, 40 Drawing Sheets

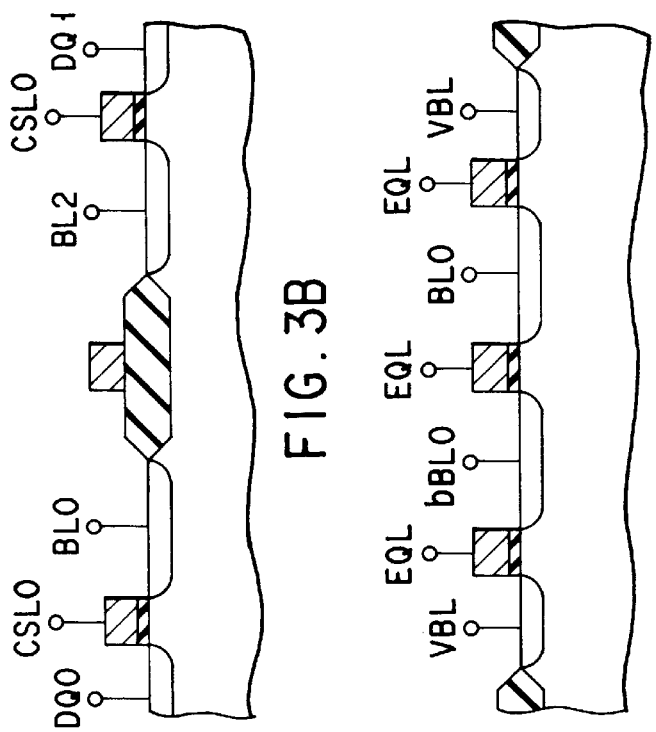
FIG. 3B
FIG. 3C
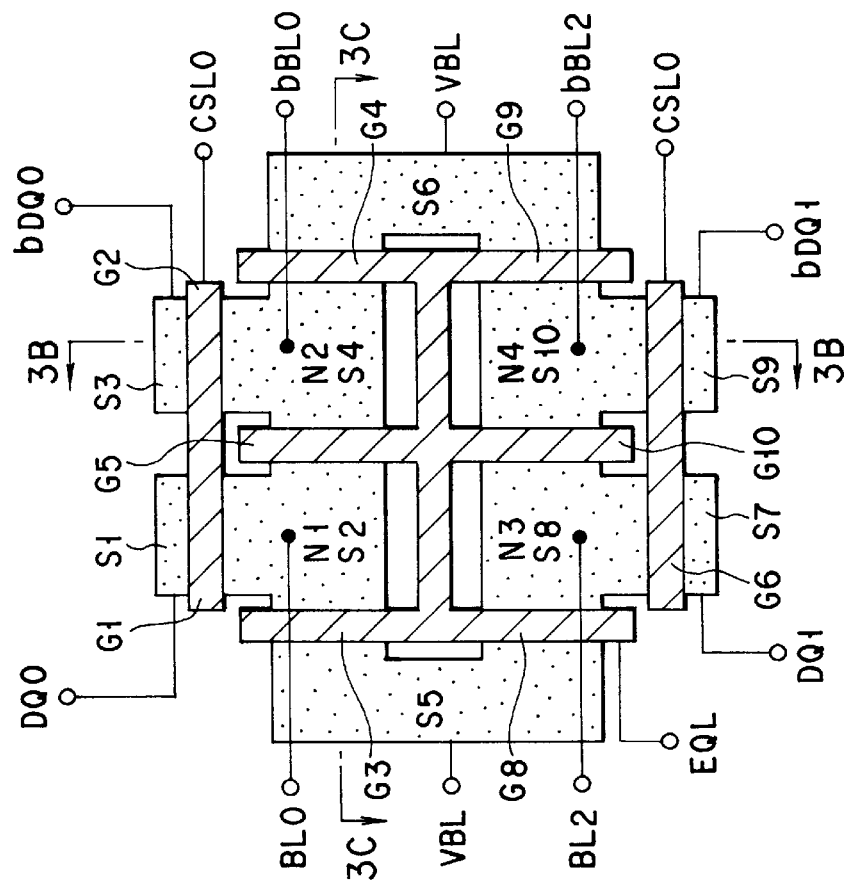
FIG. 3A (LAYER #0, LAYER #1, ⊠:CONT-02, ⊞:CONT-12)

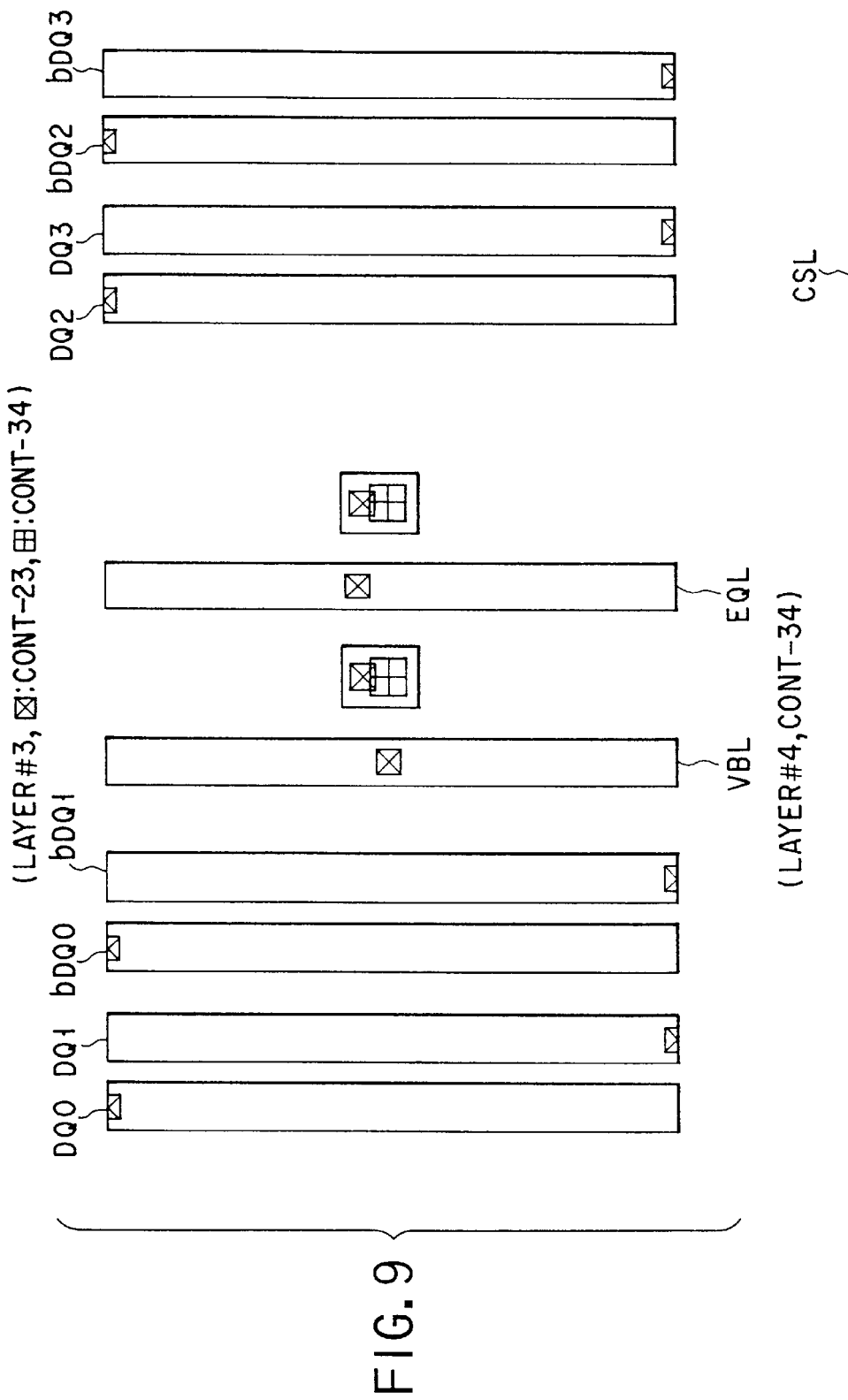

(LAYER#0, LAYER#1, ⊠:CONT-02, ⊞:CONT-12)

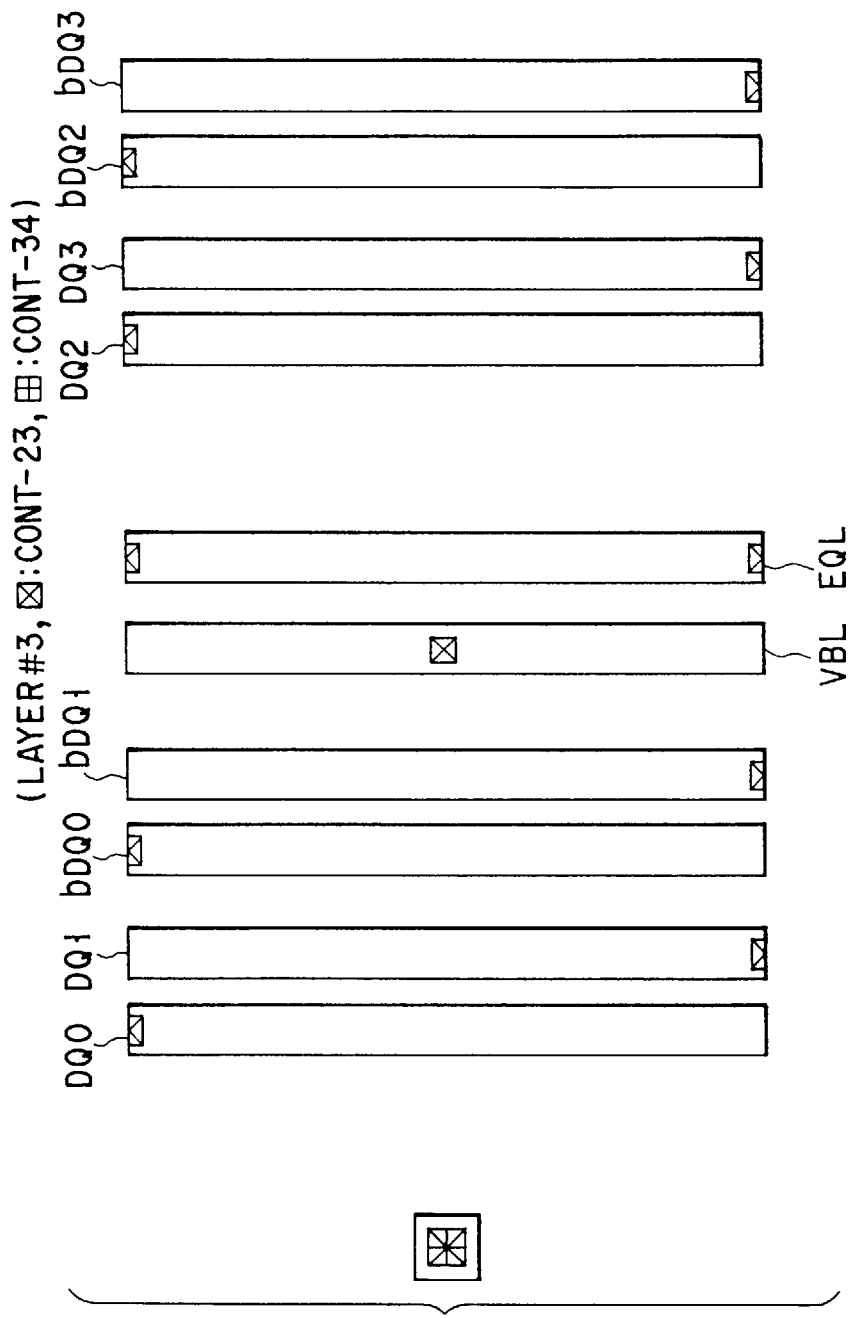
FIG. 15
FIG. 16

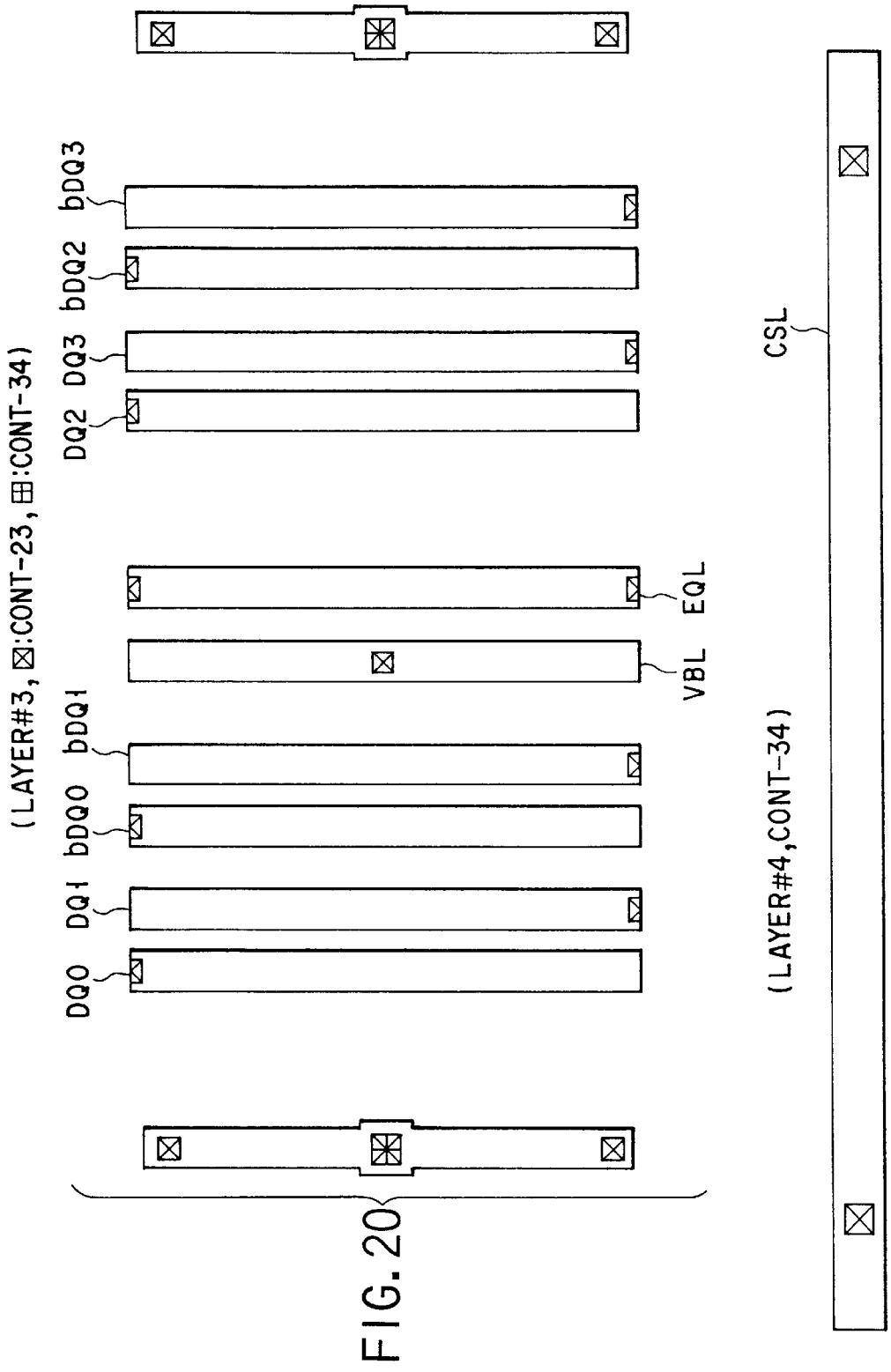

(LAYER#0, LAYER #1, ⊠:CONT-02, ⊞:CONT-12)

(LAYER #0, LAYER #1, ⊠:CONT-02, ⊞:CONT-12)

(LAYER#0, LAYER#1, ⊠:CONT-02, ⊞:CONT-12)

(LAYER #2, ⊠:CONT-2, ⊠:CONT-23, ■:CONT-02 & 23, ⊠:CONT-12 & 23)

FIG. 39 (LAYER#2, ⊠ CONT-02, ⊠ CONT-23, ■ CONT-02&23, ⊠ CONT-12&23)

FIG. 41 (LAYER#4)

(LAYER#3, ⊠:CONT-02, ■:CONT-23, ▣:CONT-02 & 23, ⊠:CONT-12 & 23 )

FIG. 46 (LAYER#4)

SEMICONDUCTOR MEMORY DEVICE WITH COLUMN GATE AND EQUALIZER CIRCUITRY

BACKGROUND OF THE INVENTION

The present invention relates to a semiconductor memory device, more particularly to an improvement in a sense amplifier of a DRAM.

In company with a recent increase in an operating speed of a microprocessor, a high speed semiconductor memory has been demanded. The advent of a large capacity semiconductor memory and popularization of a portable gadget has further necessitated low power consumption to be realized. It is effective to reduce a bitline capacitance in order to materialize a higher speed device with lower power consumption and various techniques for the purpose have conventionally been contrived.

As main factors constituting a bitline capacitance, there are named: a bitline capacitance with other wirings (including an adjacent bitline) and a diffusion capacitance in a contact portion of a bitline with a diffusion region (hereinafter referred to as bitline contact). The bitline contact is in a broad sense divided into a contact to a diffusion region of a memory cell transistor and contacts in a transfer gate, a bitline equalizer, a column gate and a sense amplifier, which constitute a sense amplifier section. Since each of circuits constituting the sense amplifier section has conventionally been constructed by an independent element pattern, a bitline contact has been required to be provided for each circuit.

As described above, since a bitline contact has conventionally provided for each circuit constituting the sense amplifier section, it has been difficult to reduce a bitline capacitance and it is, therefore, hard to realized a device with a high speed and low power consumption.

BRIEF SUMMARY OF THE INVENTION

It is an object of the present invention to provide a semiconductor memory device in which the number of bitline contacts in a sense amplifier section is reduced to decrease a bitline capacitance and thereby low power consumption and a high speed operation are realized.

A semiconductor memory device according to the present invention comprises: a semiconductor substrate; and a plurality of element regions formed in the semiconductor, wherein at least one column gate and at least one equalizer are formed as a set in one element region of the plurality of element regions.

Preferred embodiments of the present invention are as follows:

(1) At least two sets of the column gate and the equalizer are formed in one element region and a set of the column gate and the equalizer shares a diffusion layer with an adjacent set of the column gate and the equalizer.

(2) A gate electrode of the equalizer is disposed so as to divide a diffusion layer region into six regions.

(3) Circuit constitution is mainly considered, the column gate comprises: a first transistor, a gate of the first transistor being connected to a column gate select line, one of a source and a drain of the first transistor being connected to a first data line and the other being connected to a first bitline; and a second transistor, a gate of the second transistor being connected to the column gate select line, one of a source and a drain of the second transistor being connected to a second data line and the other being connected to a second bitline, and the equalizer comprises: a third transistor a gate of the third transistor being connected to an equalizer control line one of a source and a drain of the third transistor being connected to the first bitline and the other being connected to an equalizer voltage supply line; a fourth transistor, a gate of the fourth transistor being connected to the equalizer control line, one of a source and a drain of the fourth transistor being connected to the second bitline and the other being connected to the equalizer voltage supply line; and a fifth transistor, a gate of the fifth transistor being connected to the equalizer control line, one of a source and a drain of the fifth transistor being connected to the first bitline and the other being connected to the second bitline, wherein the other of a source and drain of the first transistor, one of a source and drain of the third transistor and one of a source and drain of the fifth transistor are connected to the first bitline through a common contact and the other of a source and drain of the second transistor, one of a source and drain of the fourth transistor and the other of a source and drain of the fifth transistor are connected to the second bitline through a common contact.

(4) Configuration of transistor is mainly considered, the column gate comprises first and second column gates; the equalizer comprises first and second equalizers; the first column gate comprises first and second transistors; the first equalizer comprises: a third transistor having a first common node in common owned by the first transistor; a fourth transistor having a second common node in common owned by the second transistor; and a fifth transistor having the first and second common nodes; the second column gate comprises sixth and seventh transistors; the second equalizer comprises: an eighth transistor having a third common node in common owned by the sixth transistor; a ninth transistor having a fourth common node in common owned by the seventh transistor; and a tenth transistor having the third and fourth common nodes.

(5) In (4), the one element region comprises the first and second sets of the column gate and the equalizer formed therein in an adjacent manner, wherein diffusion layers of the first and second transistors of the first column gate of the first set are shared by diffusion layers of the sixth and seventh transistors of the second column of the second set.

(6) In (5), the shared diffusion layer is provided with a contact and the gate electrode of the column gate is disposed so as to surround the equalizer.

(7) In (5) or (6), a first set and a second set of the column gate and the equalizer is disposed parallel to a bitline.

(8) In (7), a equalizer control line is disposed normal to the bitline, and the equalizer control line is made of an upper wiring layer than a wiring layer of the bitline.

(9) In (8), at least one bitline precharge voltage supply line is disposed between the first set and the second set disposed in an adjacent manner, the bitline precharge voltage supply line is disposed normal to the bitline, and the bitline precharge voltage supply line is made of an upper wiring layer than a wiring layer of the bitline.

(10) In (8), at least two bitline precharge voltage supply lines are disposed normal to the bitline.

(11) In (10), at least one bitline precharge voltage supply line is disposed at both ends of the first and second sets, which are disposed in an adjacent manner, in a direction parallel to the bitline.

(12) In (10), at least one bitline precharge voltage supply line is disposed at both ends of each of the first and second sets, which are disposed in an adjacent manner, in a direction parallel to the bitline.

(13) In (7), gate electrodes of the equalizers included in a first set and a second set disposed in an adjacent manner are connected to by a common gate wiring.

(14) In (5), the first transistor comprises: a first diffusion region; a second diffusion region, which constitutes the second common node; and a first gate electrode, which is provided between the first and second diffusion regions; the second transistor comprises: a third diffusion region; a fourth diffusion region, which constitutes the second common node; a second gate electrode, which is provided between the third and fourth diffusion regions; the third transistor comprises: the second diffusion region; a fifth diffusion region; a third gate electrode, which is provided between the second and fifth diffusion regions; the fourth transistor comprises: the fourth diffusion region; a sixth diffusion region; a fourth gate electrode, which is provided between the fourth and six diffusion regions; the fifth transistor comprises: the second diffusion region; the fourth diffusion region; a fifth gate electrode, which is provided between the second and fourth diffusion regions; the sixth transistor comprises: a seventh diffusion region; a eighth diffusion region, which constitutes the third node; a sixth gate electrode, which is provided between the seventh and eighth diffusion regions; the seventh transistor comprises: a ninth diffusion region; a tenth diffusion region, which constitutes the fourth node; a seventh gate electrode, which is provided between the ninth and tenth diffusion regions; the eighth transistor comprises: the fifth diffusion region; the eighth diffusion region; a eighth gate electrode, which is provided between the fifth and eighth diffusion regions; the ninth transistor comprises: the sixth diffusion region; the tenth diffusion region; a ninth gate electrode, which is provided between the sixth and tenth diffusion regions; and the tenth transistor comprises: the eighth diffusion region; the tenth diffusion region; a tenth gate electrode, which is provided between the eighth and tenth diffusion regions.

(15) In (14), the first diffusion region is connected to a first data line, the second diffusion region is connected to a first bitline, the third diffusion region is connected to a second data line, the fourth diffusion region is connected to a second bitline, the fifth and sixth diffusion regions are connected to an equalizer voltage supply line, the seventh diffusion region is connected to a third data line, the eighth diffusion region is connected to a third bitline, the ninth diffusion region is connected to a fourth data line and the tenth diffusion region is connected to a fourth bitline, and the first, second, sixth and seventh gate electrodes are connected to a column gate select line and the third, fourth, fifth, eighth, ninth and tenth gate electrodes are connected to a equalizer control line.

(16) In (15), a potential of the equalizer voltage supply line is a precharge potential of a bitline.

(17) Global pattern is mainly considered and in (4), at least two equalizers are formed in one element region, further comprising an equalizer control line connected to each gate electrode of the third to fifth and eighth to tenth transistors of the two equalizers formed in one element region.

(18) In (17), at least two column gates are formed in one element region and the first to fourth column gates of the adjacent two column gates are connected to a common control line.

(19) In (4), at least two column gates are formed in one element region and the first to fourth column gates of the adjacent two column gates are connected to a common control line.

According to the present invention, at least one set of an element pattern of a column gate and an element pattern of an equalizer is formed in the same element region. Thus, a contact between a bitline and a diffusion region can be shared, in which a contact has conventionally been required for each, so that the number of contacts can be reduced in a sense amplifier section. Therefore, a bitline capacitance in the sense amplifier section can be reduced, which enables a high speed operation and low power consumption in a sense operation to be achieved. Besides, it is possible to increase a gate width of a transistor for supplying a precharge voltage in an equalizer and to realize a high speed operation in an equalizing operation as compared with a conventional technique of its kind. Since a space between adjacent bitlines can be larger as compared with a conventional case, an improvement on wiring margin of a bitline can be obtained, which makes a production yield increased. In addition, since element patterns of a column gate and an equalizer are formed in the same element region, an area for a sense amplifier section can be decreased as compared with the case where both patterns are separately disposed.

In the present invention, element patterns of a column gate and an equalizer are formed in the same element region and thereby a bitline contact can be shared by the column gate and the equalizer, which enables the number of bitline contacts to be decreased. Therefore, a bitline capacitance in the sense amplifier section is reduced and furthermore a high speed operation and low power consumption in a sense operation can be achieved. Since element patterns of a column gate and an equalizer are formed in the same element region, a high speed operation in an equalizing operation and an improvement in wiring margin of a bitline, reduction of an area for a sense amplifier section and the like can be realized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL
VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3A is a view showing a part of the pattern of FIG. 2 and FIGS. 3B, 3C are respectively views showing structures in section taken along line 3B—3B and 3C—3C of FIG. 3A;

FIG. 9 is a view showing a third wiring layer, a contact for connecting the second wiring layer to the third wiring layer, and a contact for connecting the third wiring layer to a fourth wiring layer in the example of the first layout according to an embodiment of the present invention;

FIG. 10 is a view showing a fourth wiring layer, and a contact for connecting the third wiring layer to the fourth wiring layer in the example of the first layout according to an embodiment of the present invention;

Figure 12:
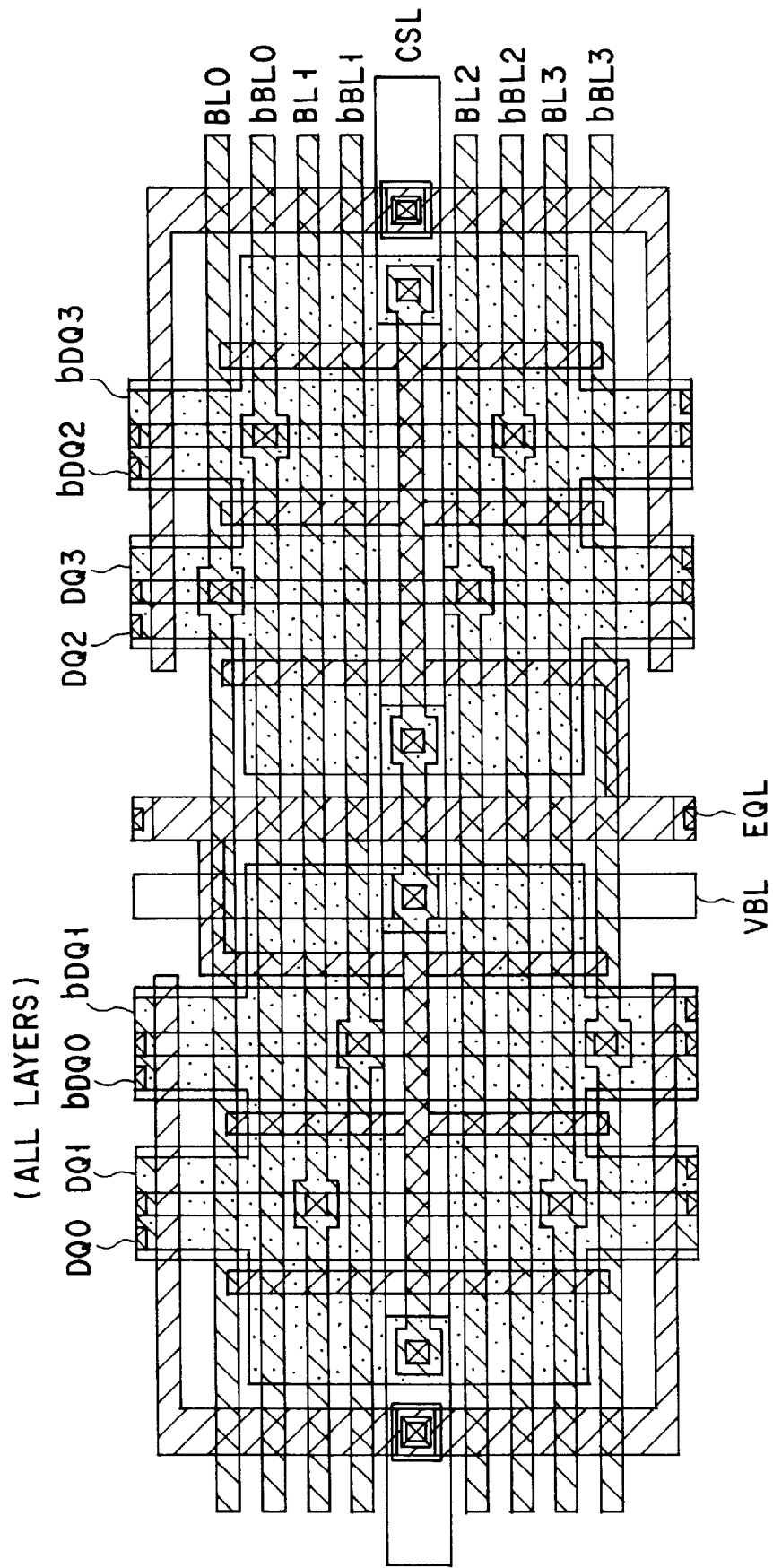
Figure 13:
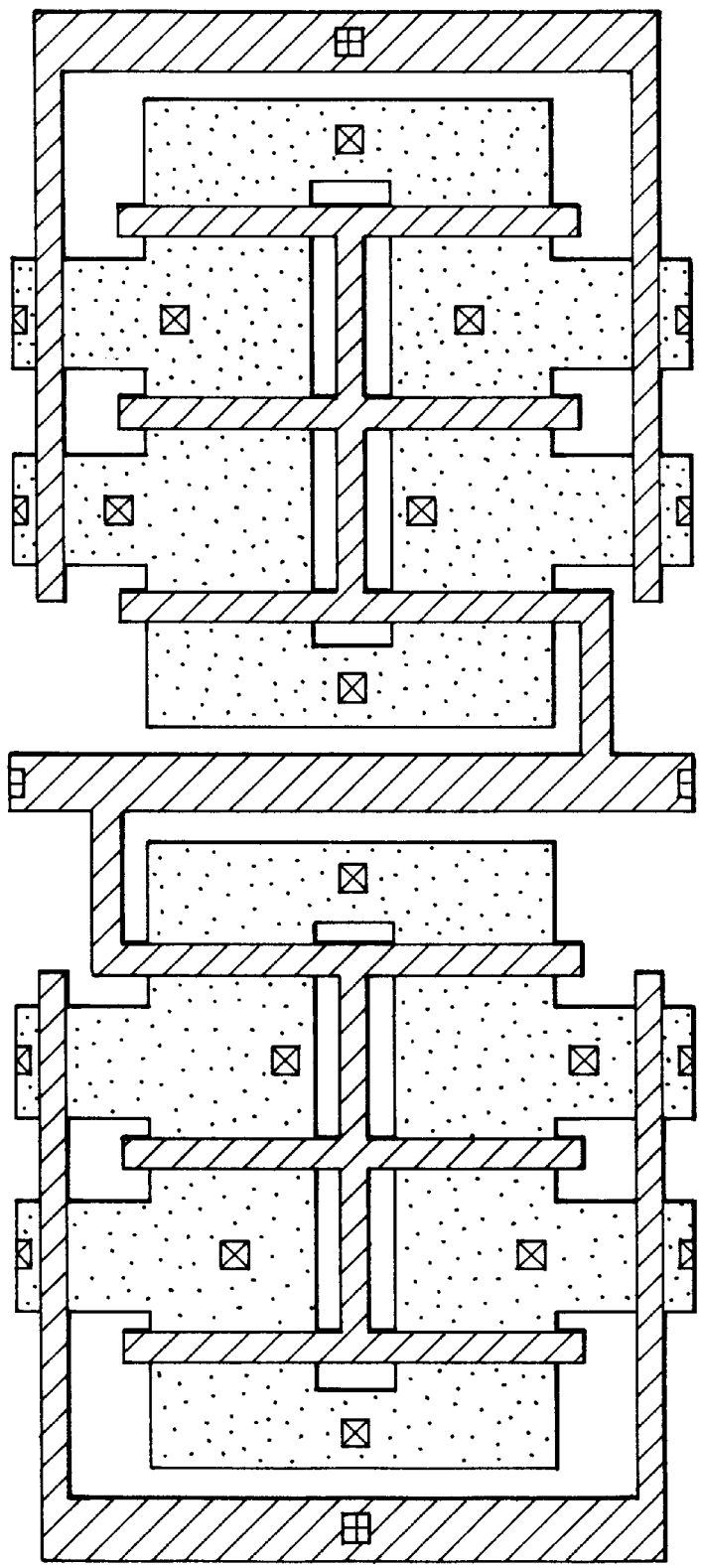
Figure 14:
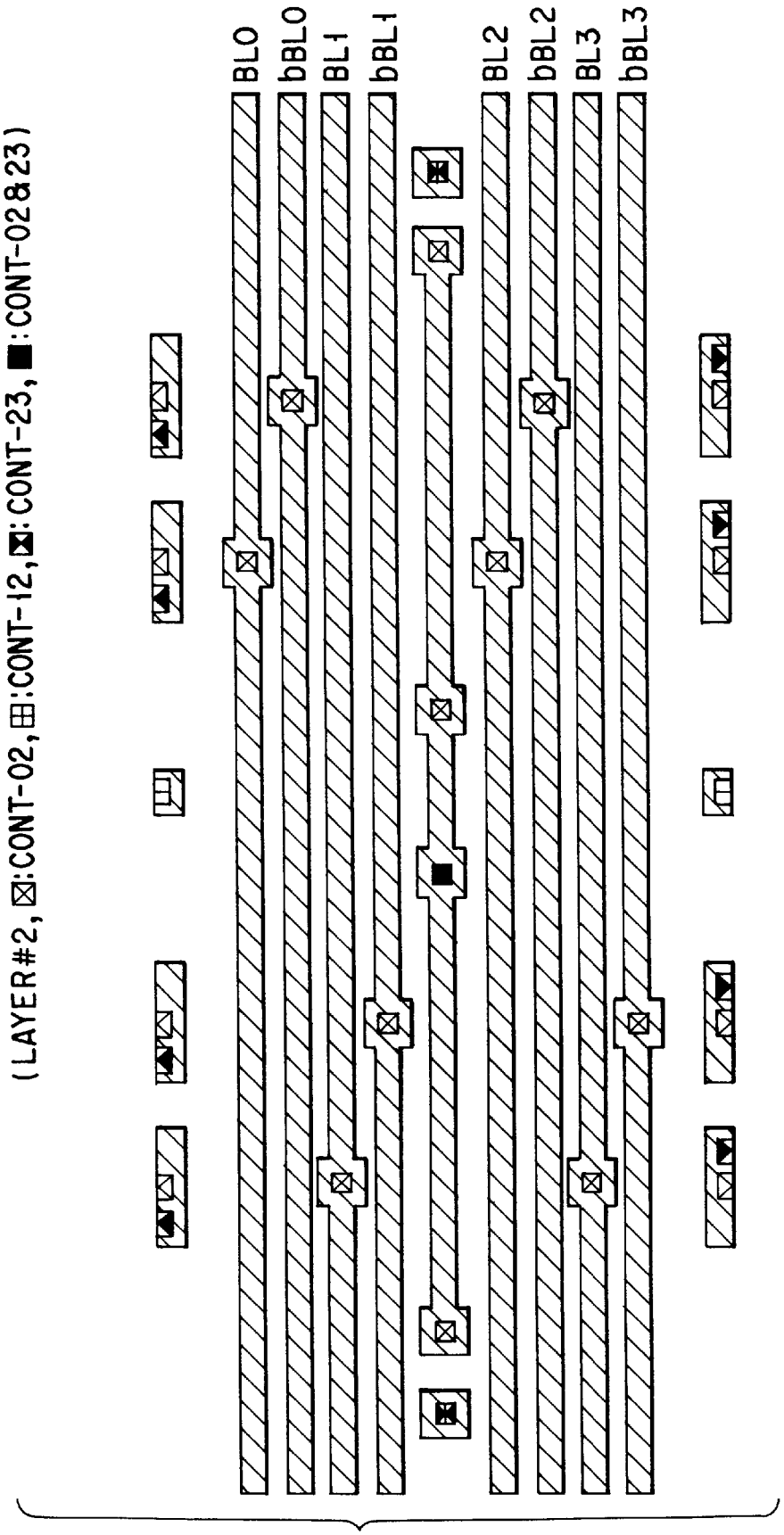
Figure 17:
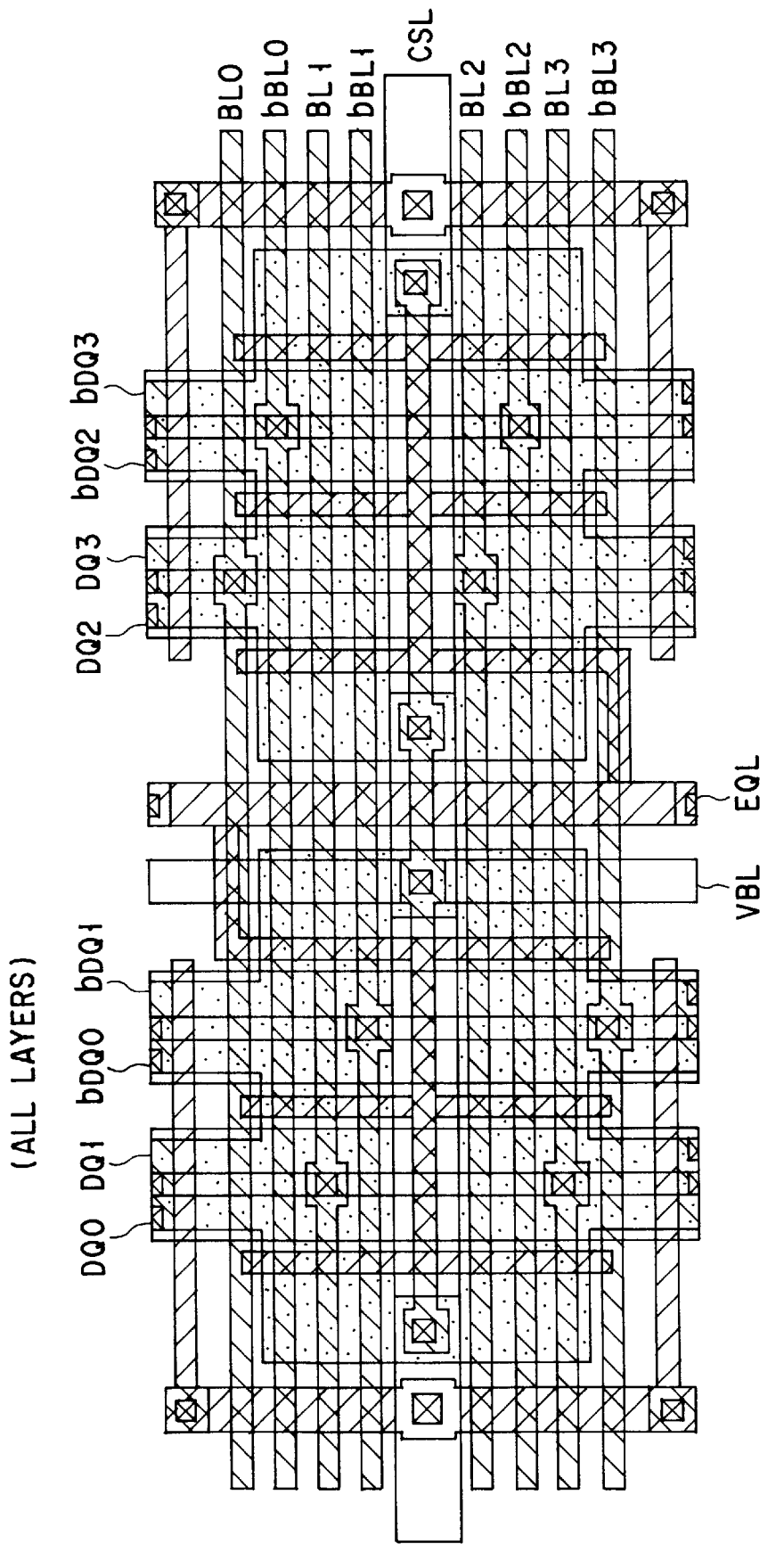
Figure 18:
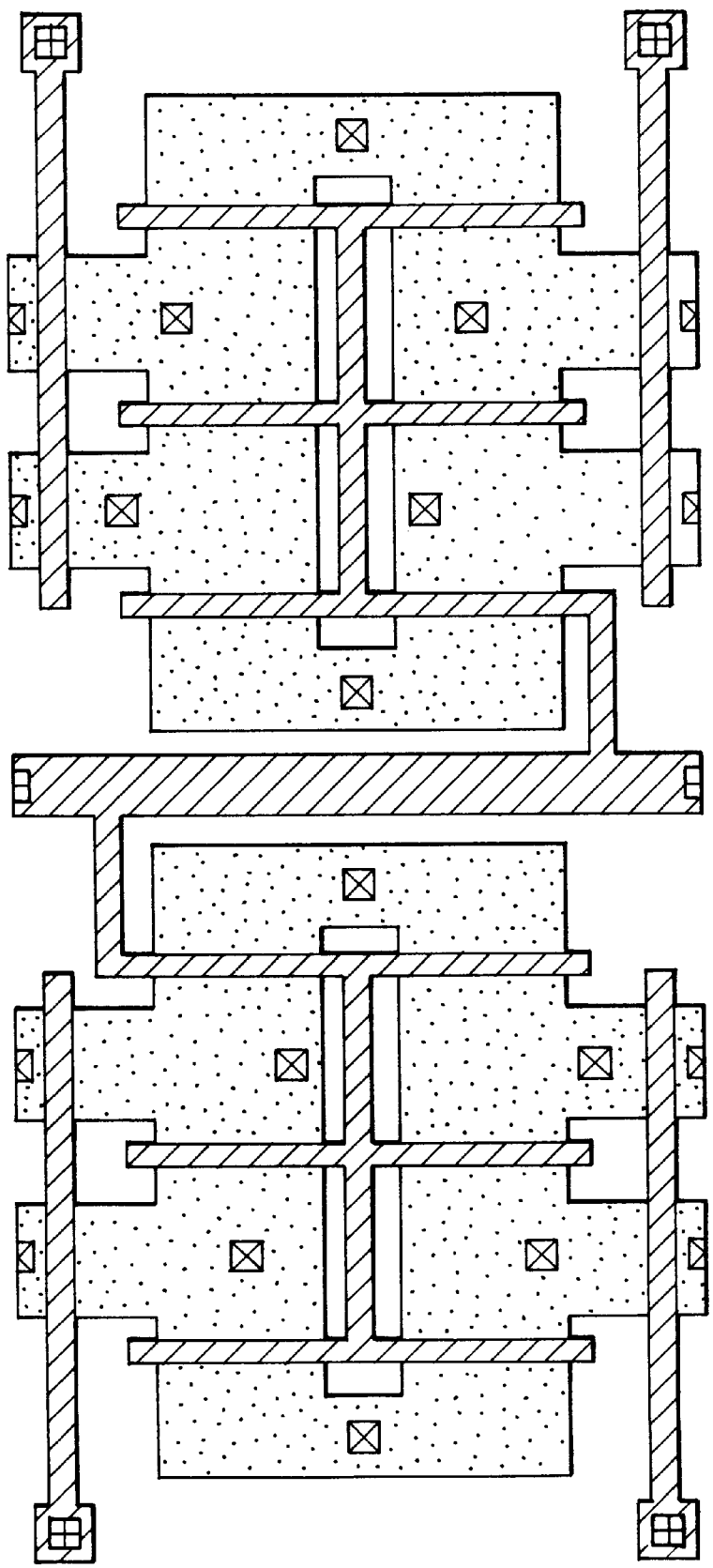
Figure 19:
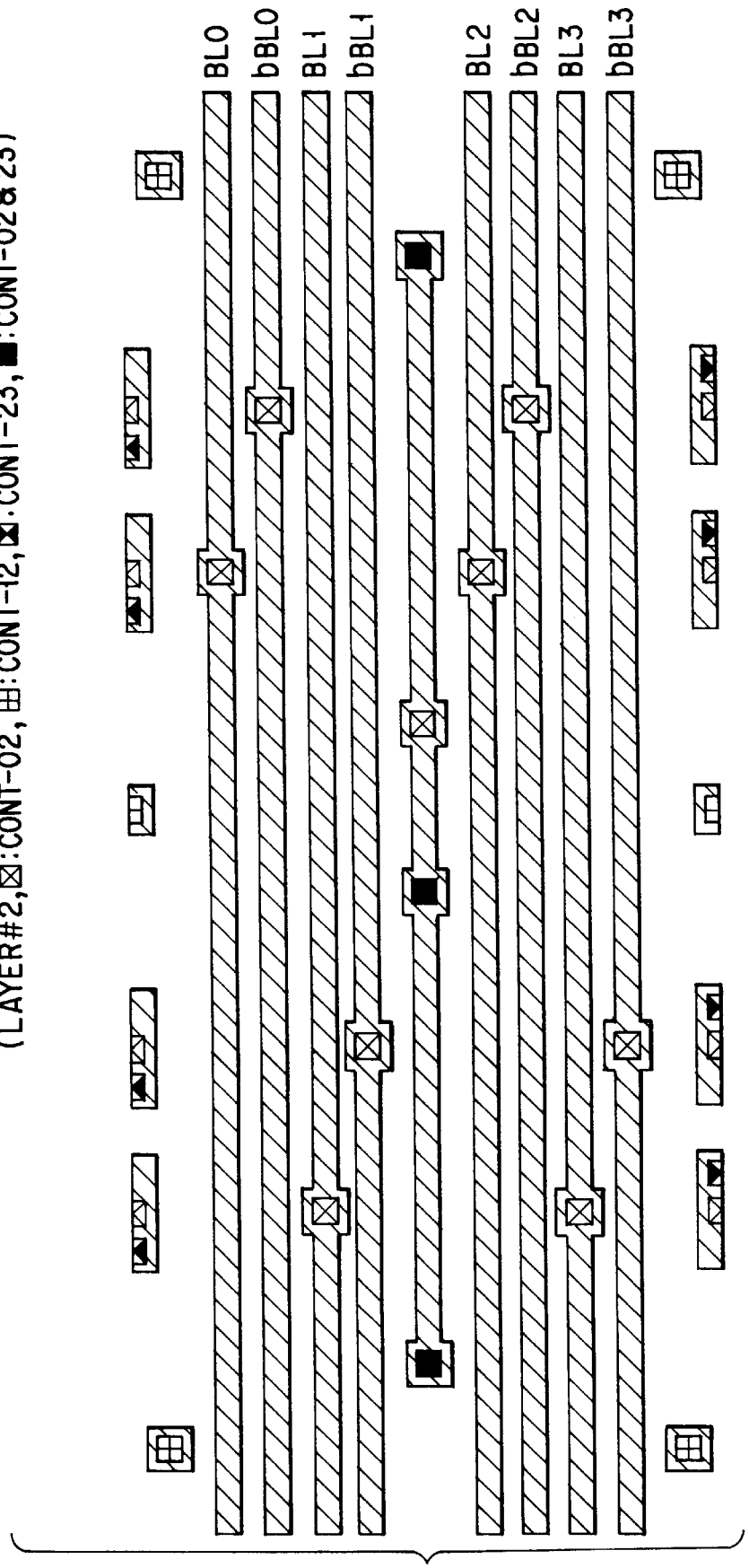
Figure 22:
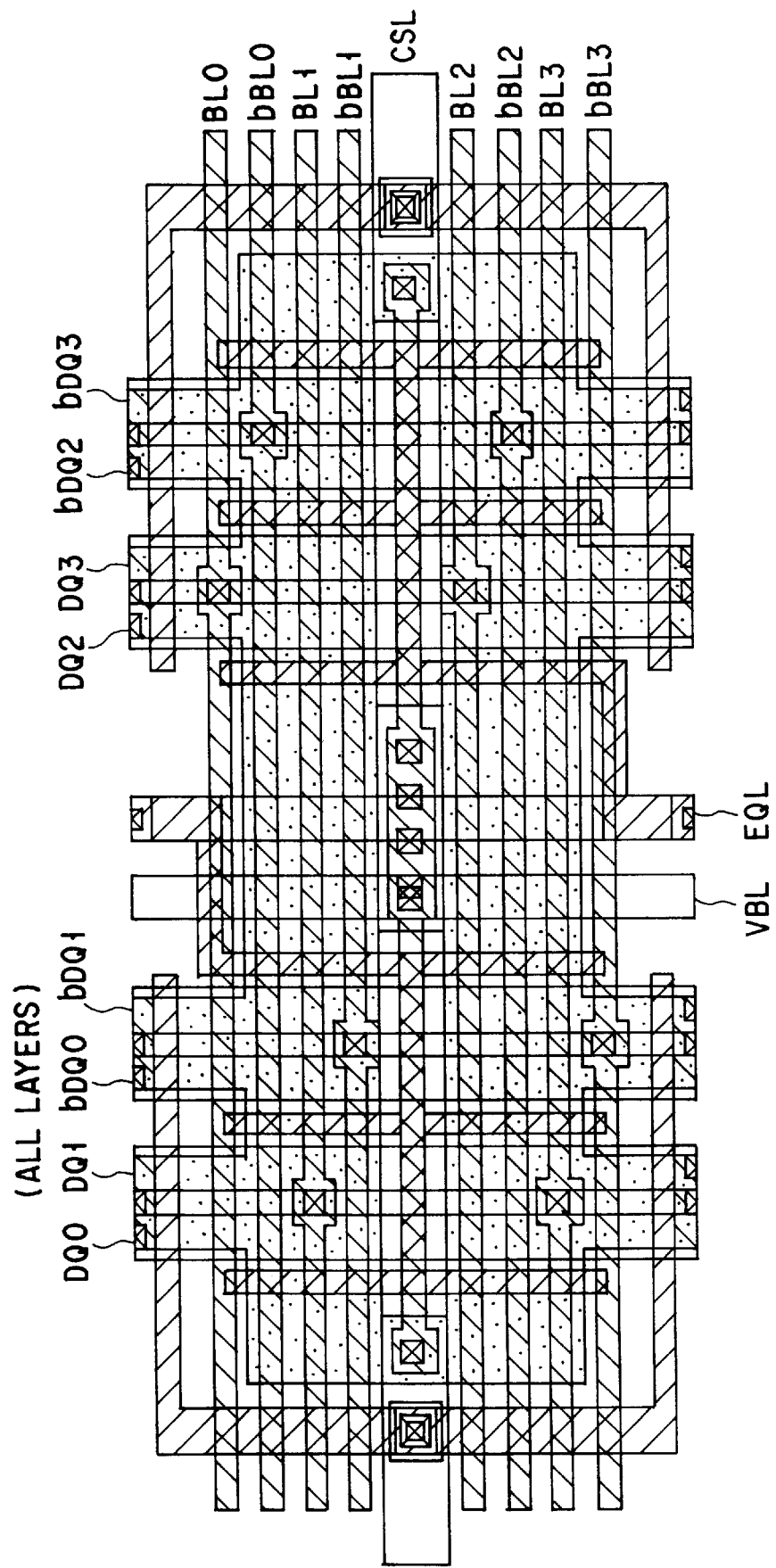
Figure 23:
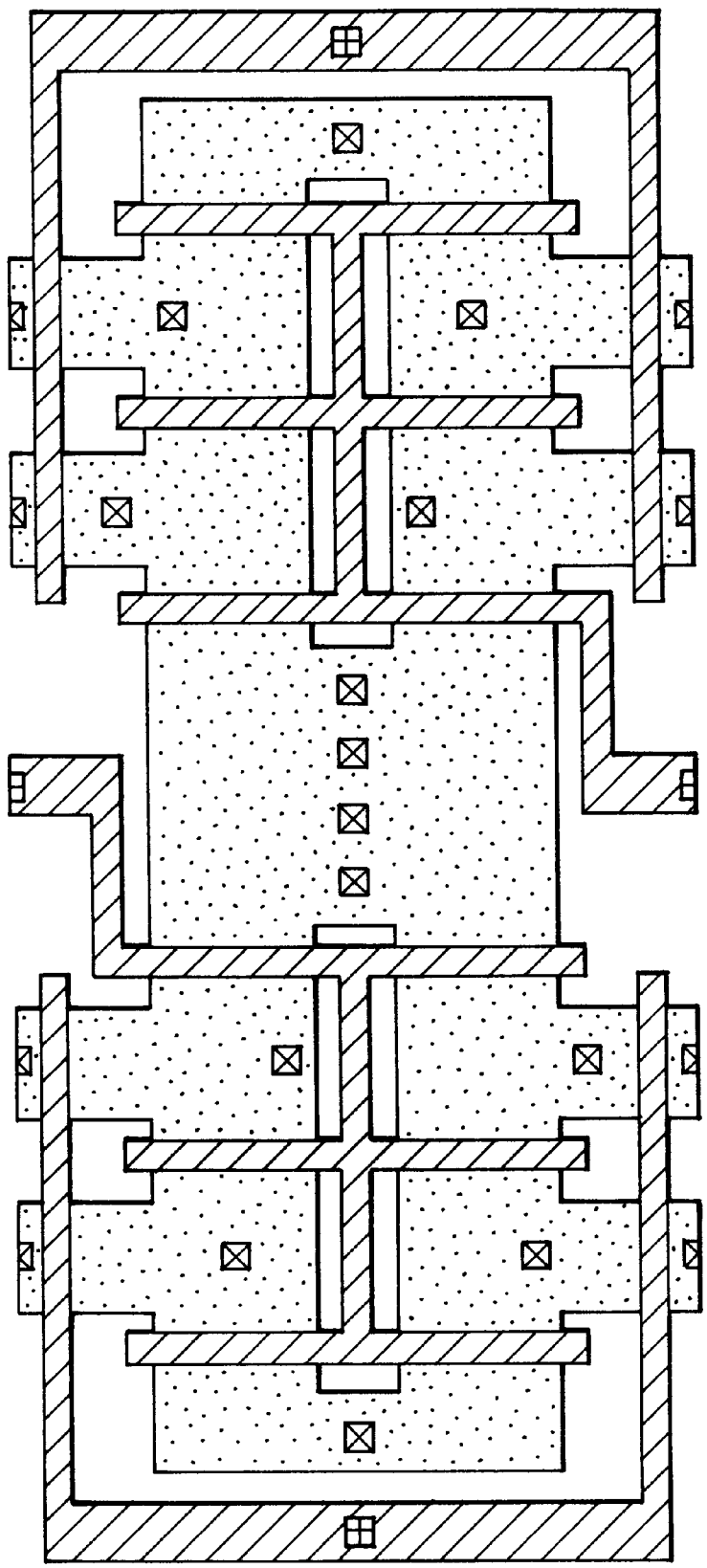
Figure 24:
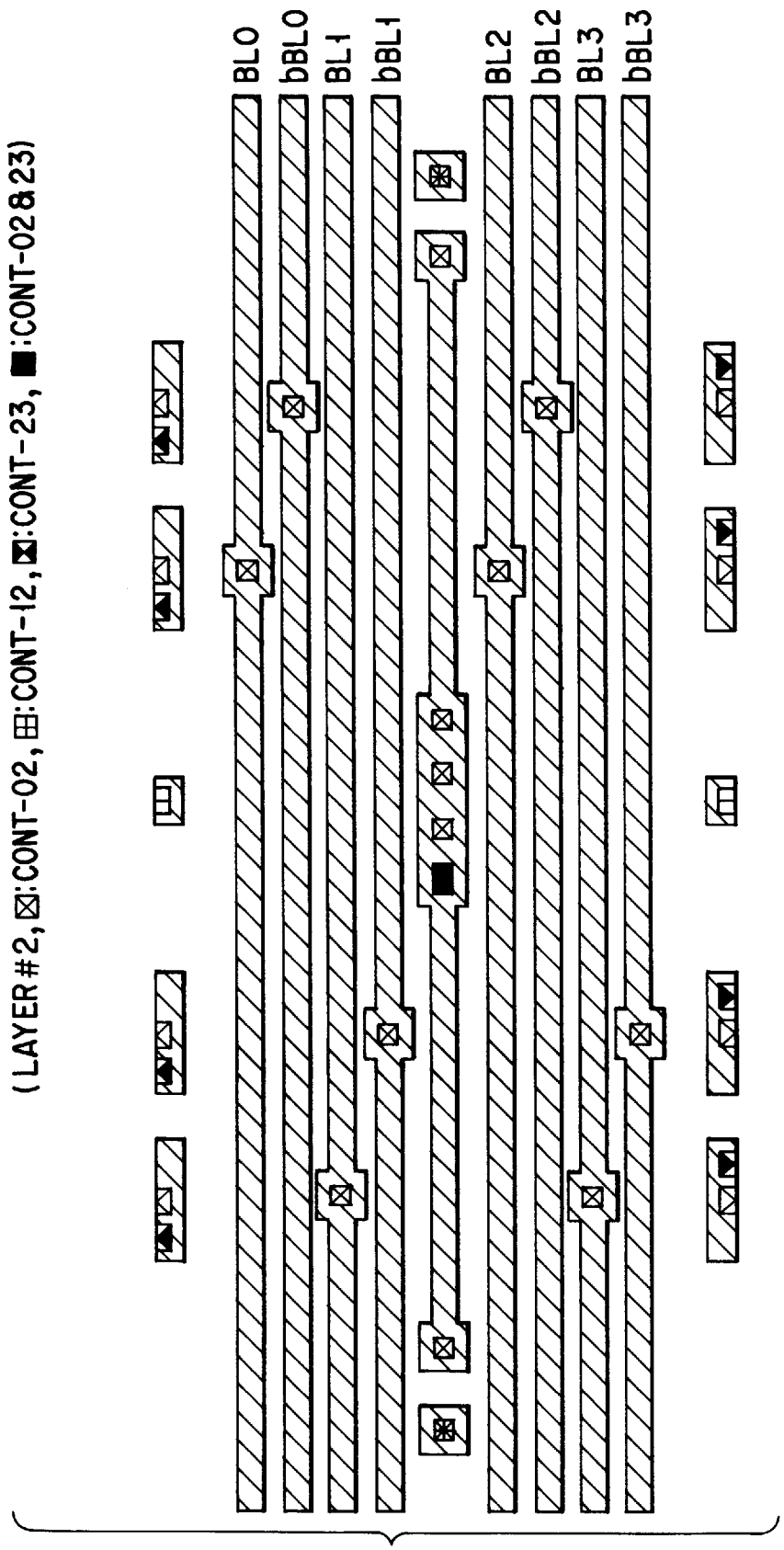
Figure 25:
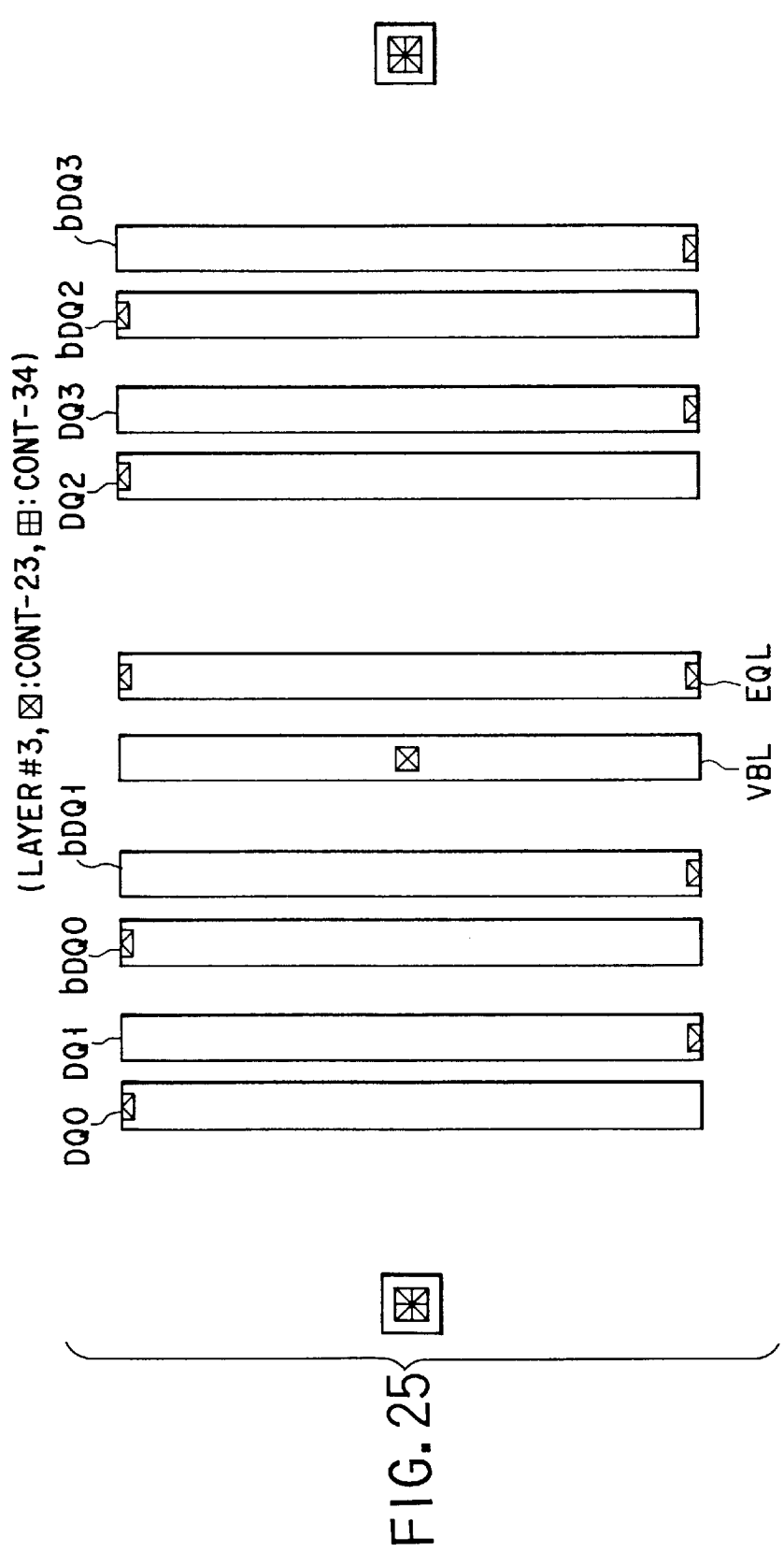
Figure 26:
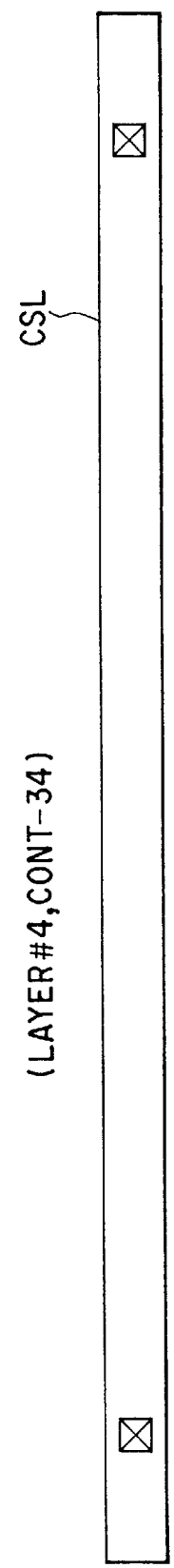
Figure 27:
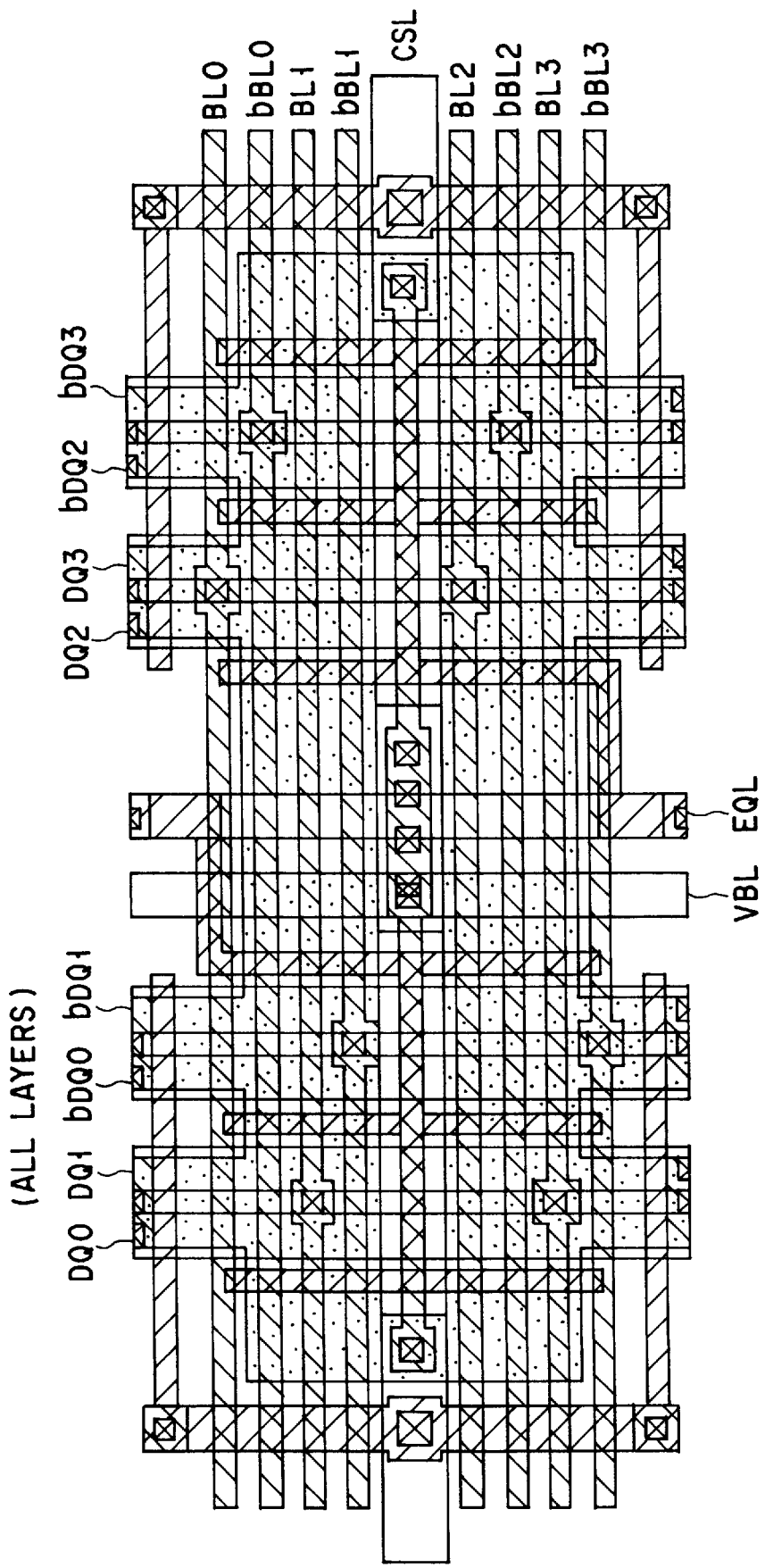
Figure 28:
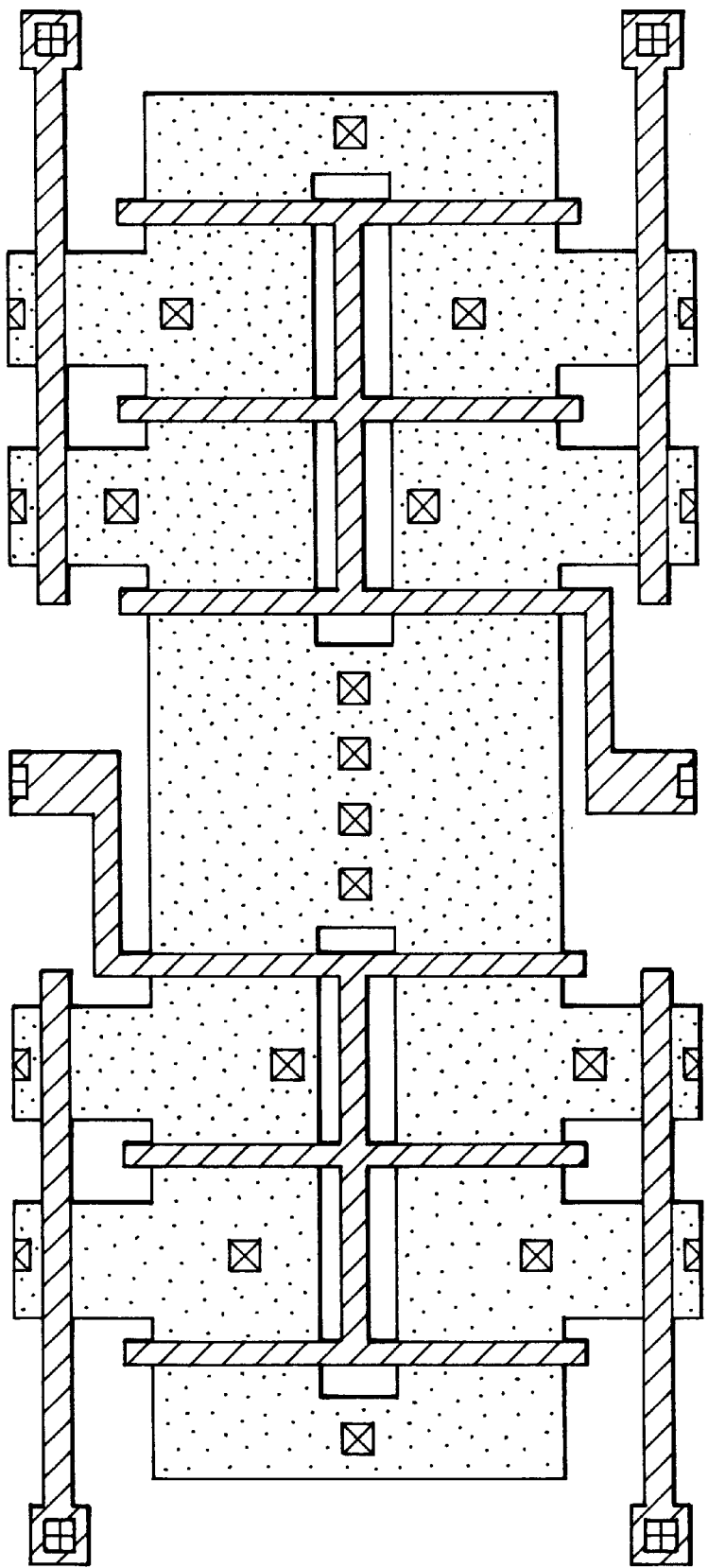
Figure 29:
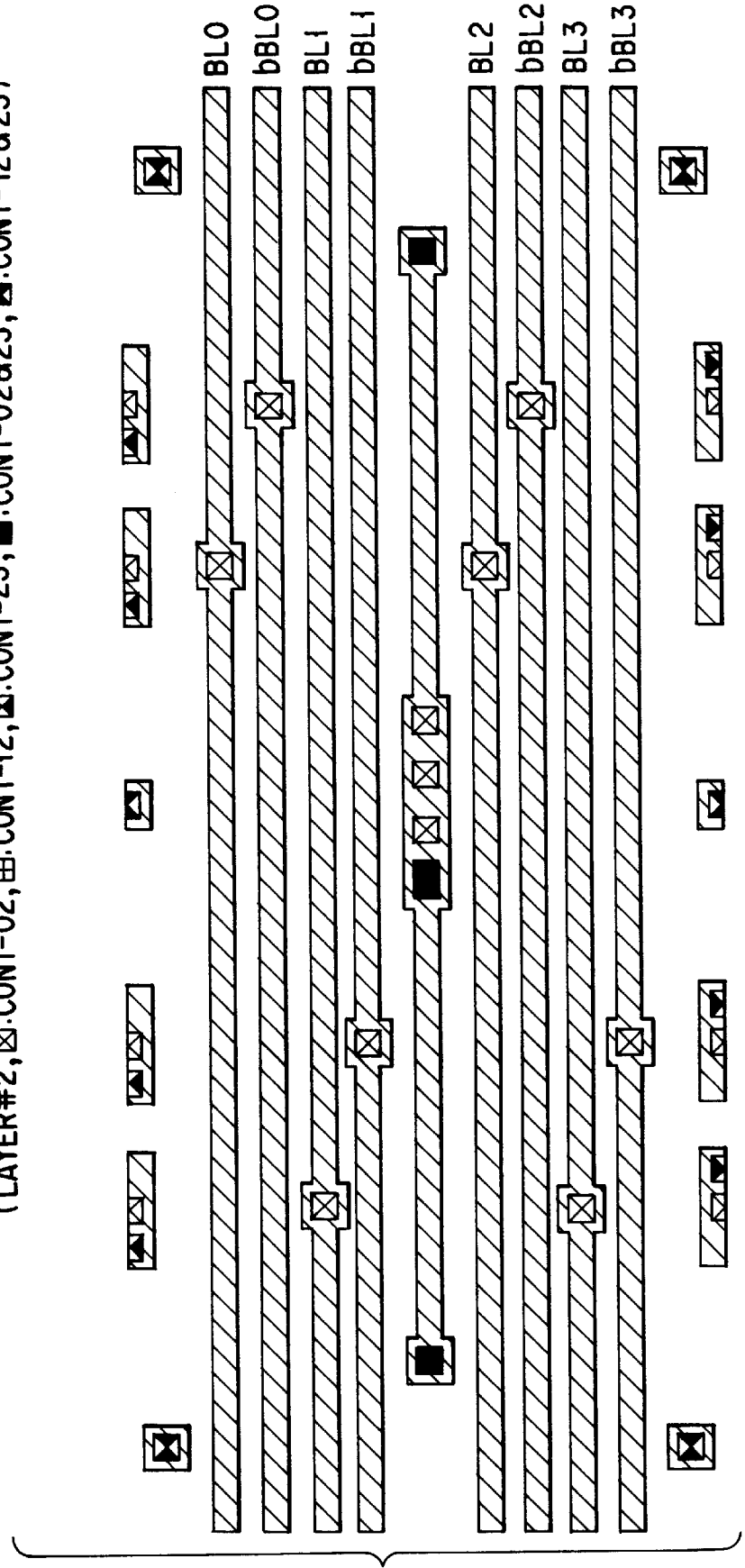
Figures 30, 31:
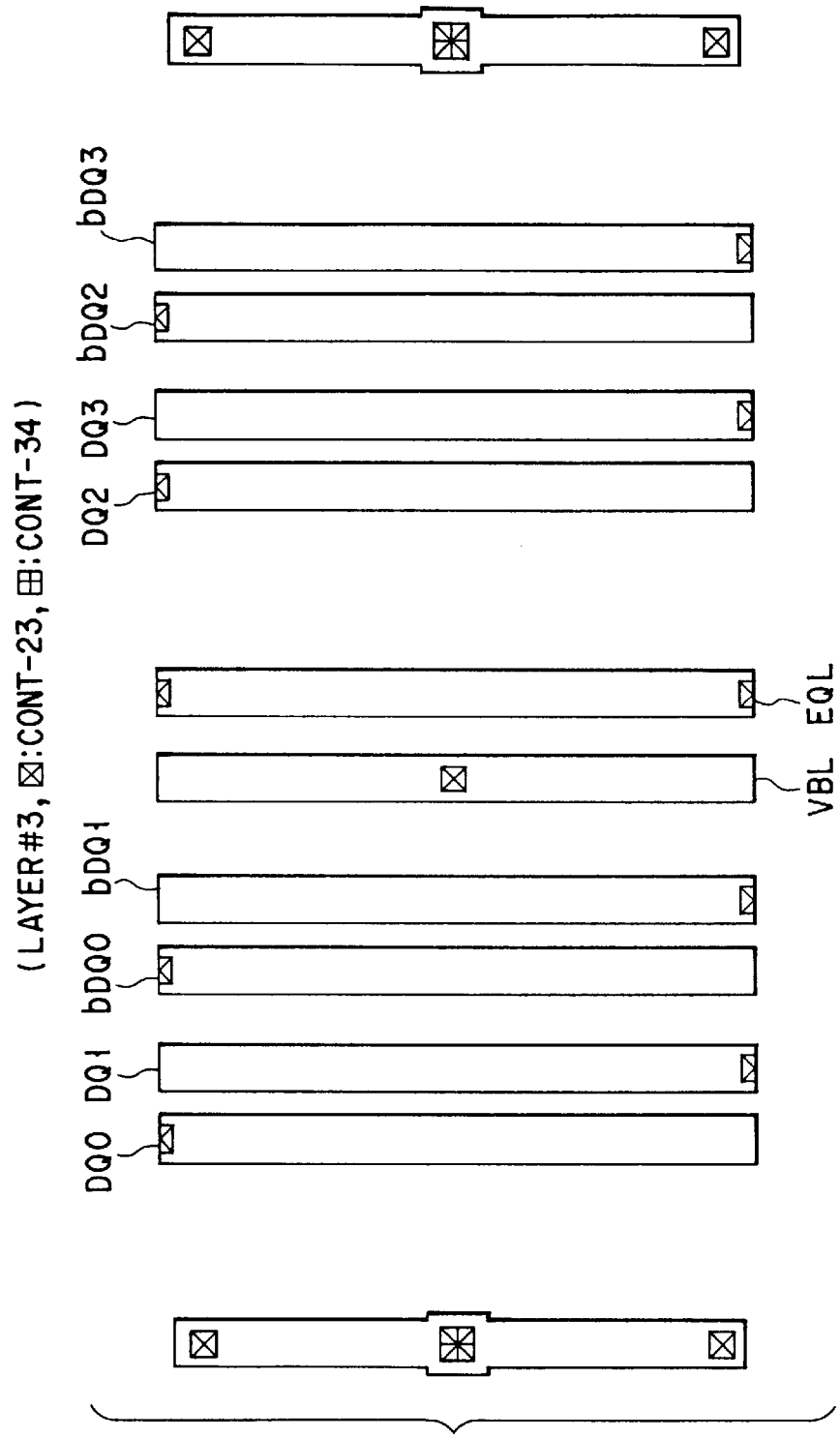
Figure 32:
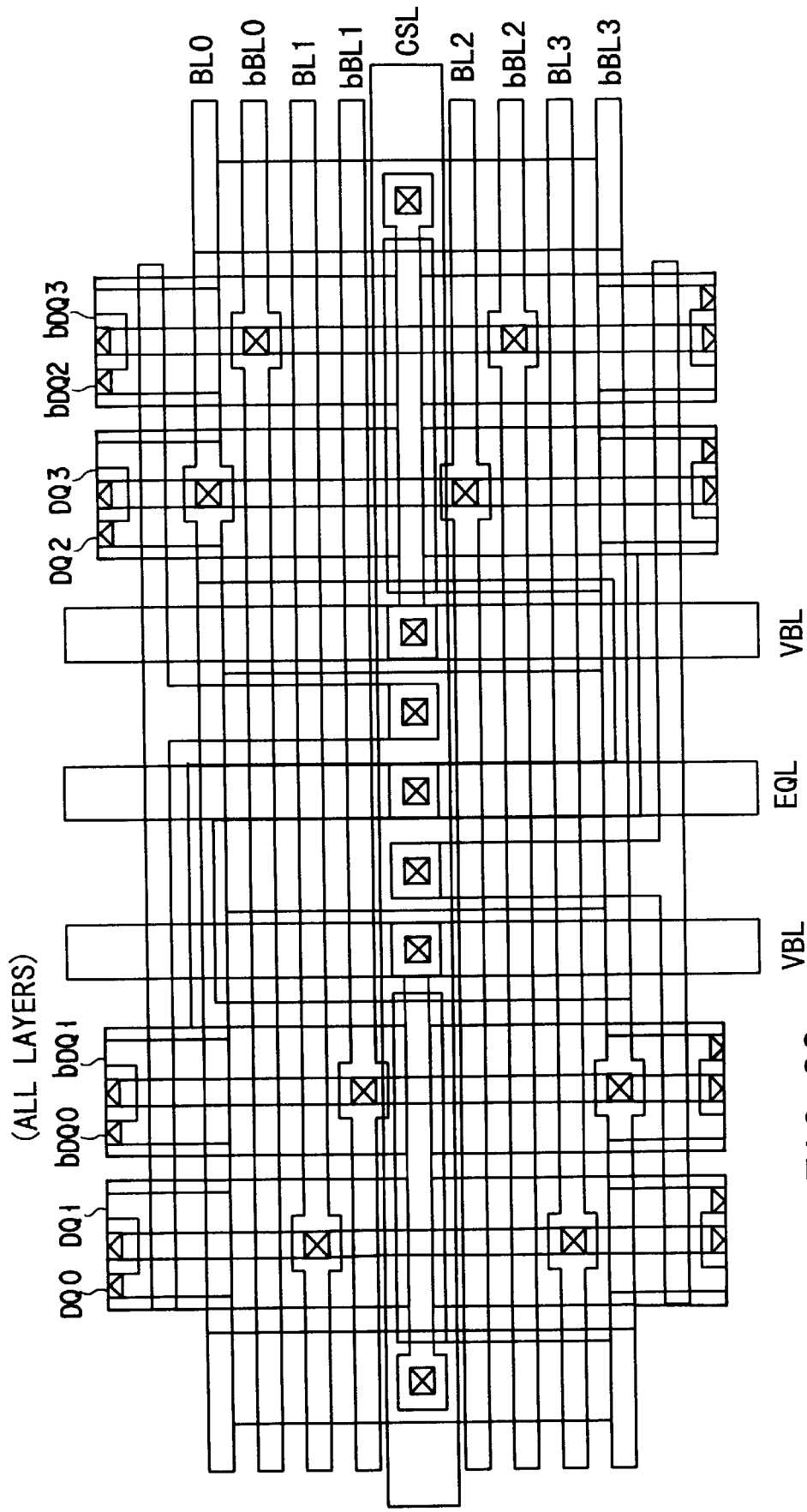
Figure 33:
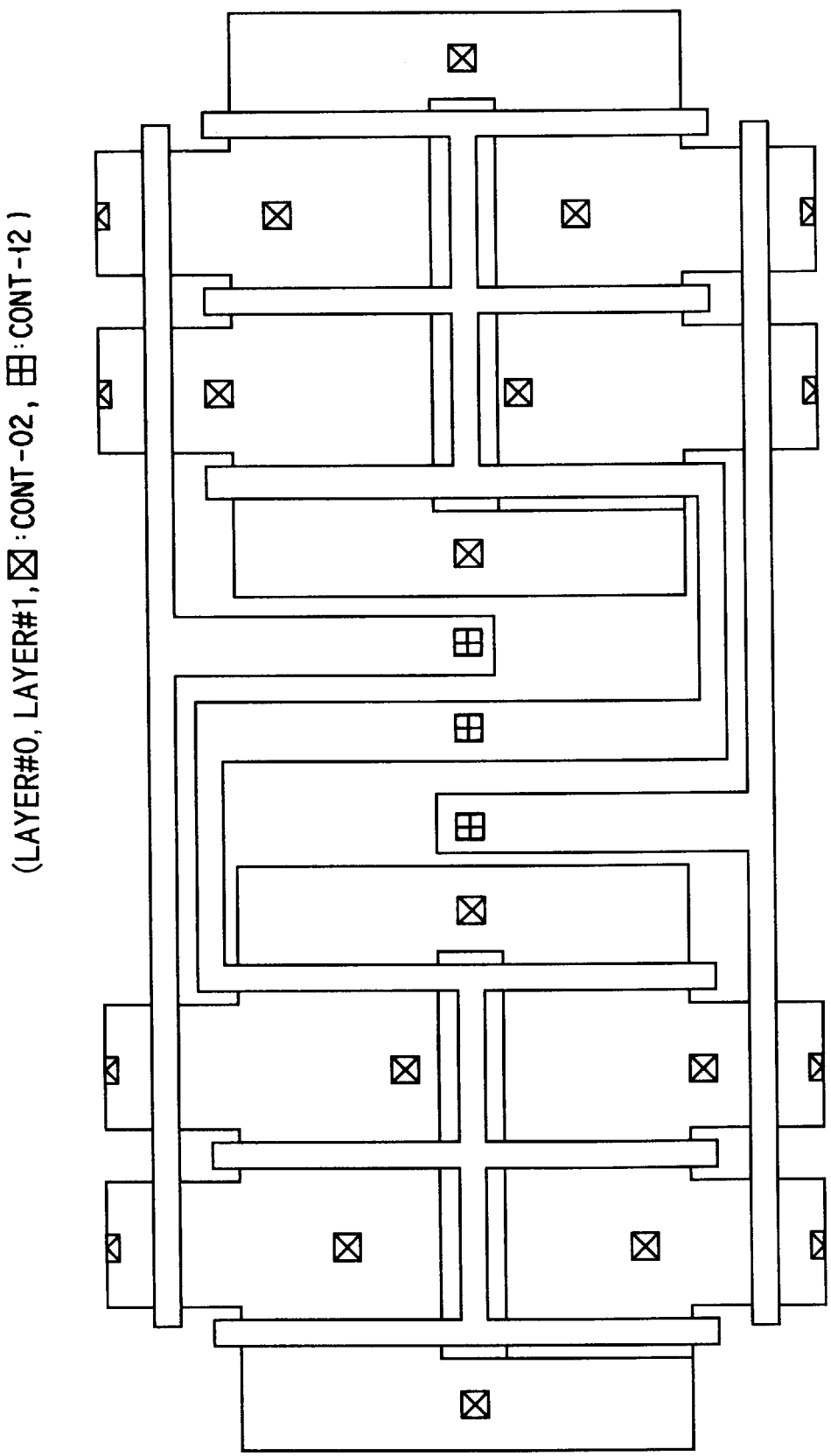
Figure 34:
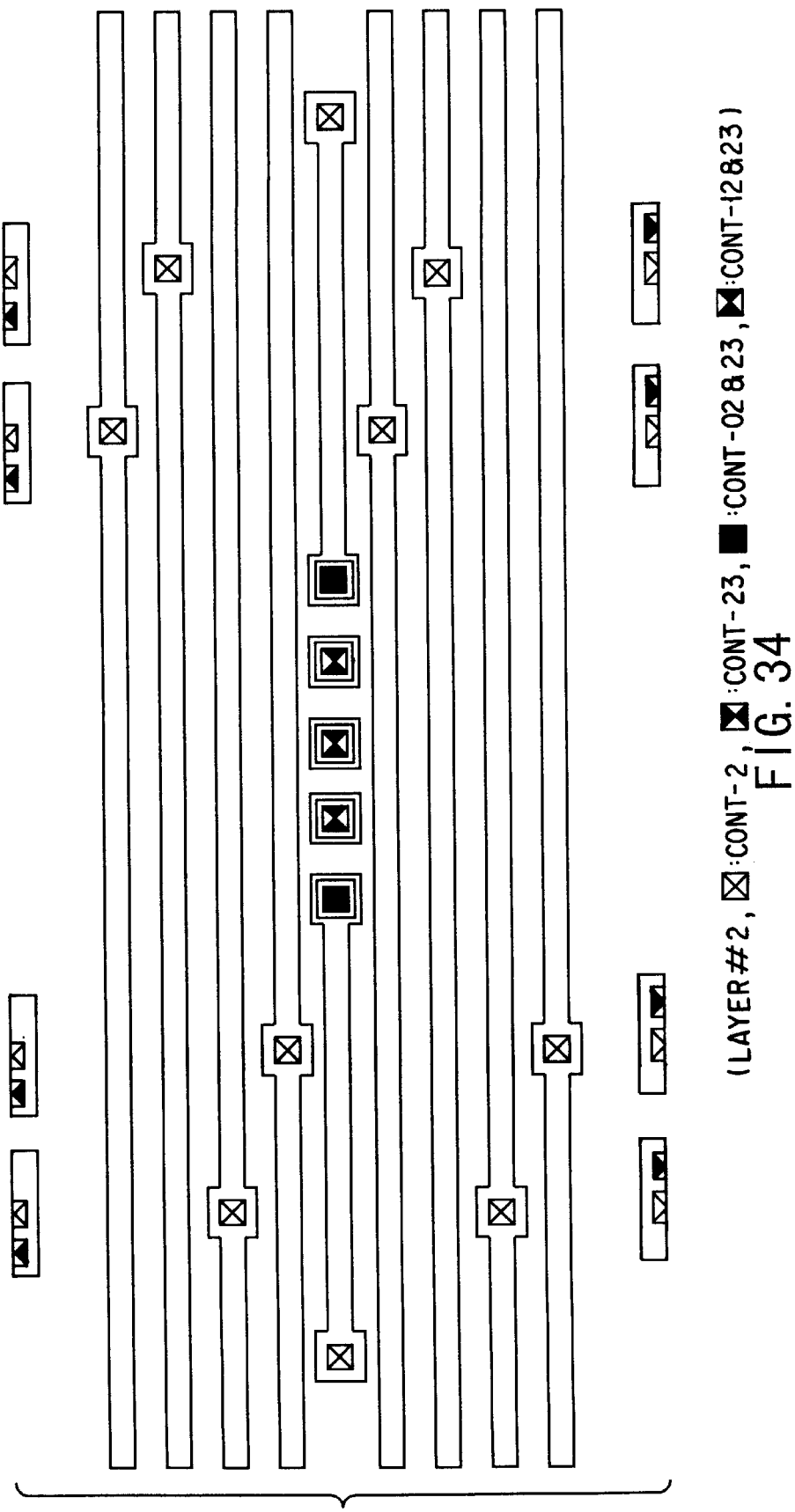
Figure 35:
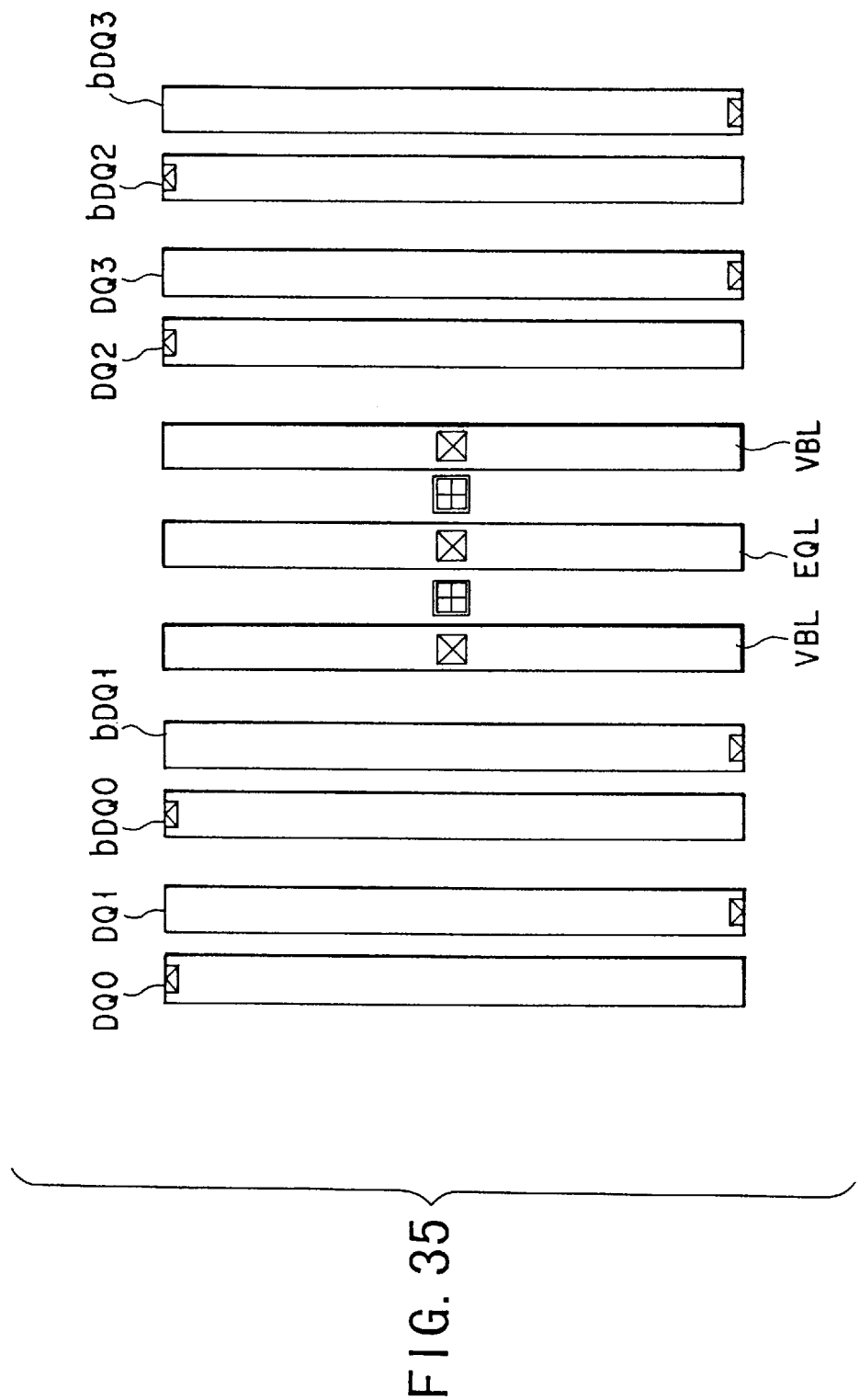
Figure 36:
Figure 37:
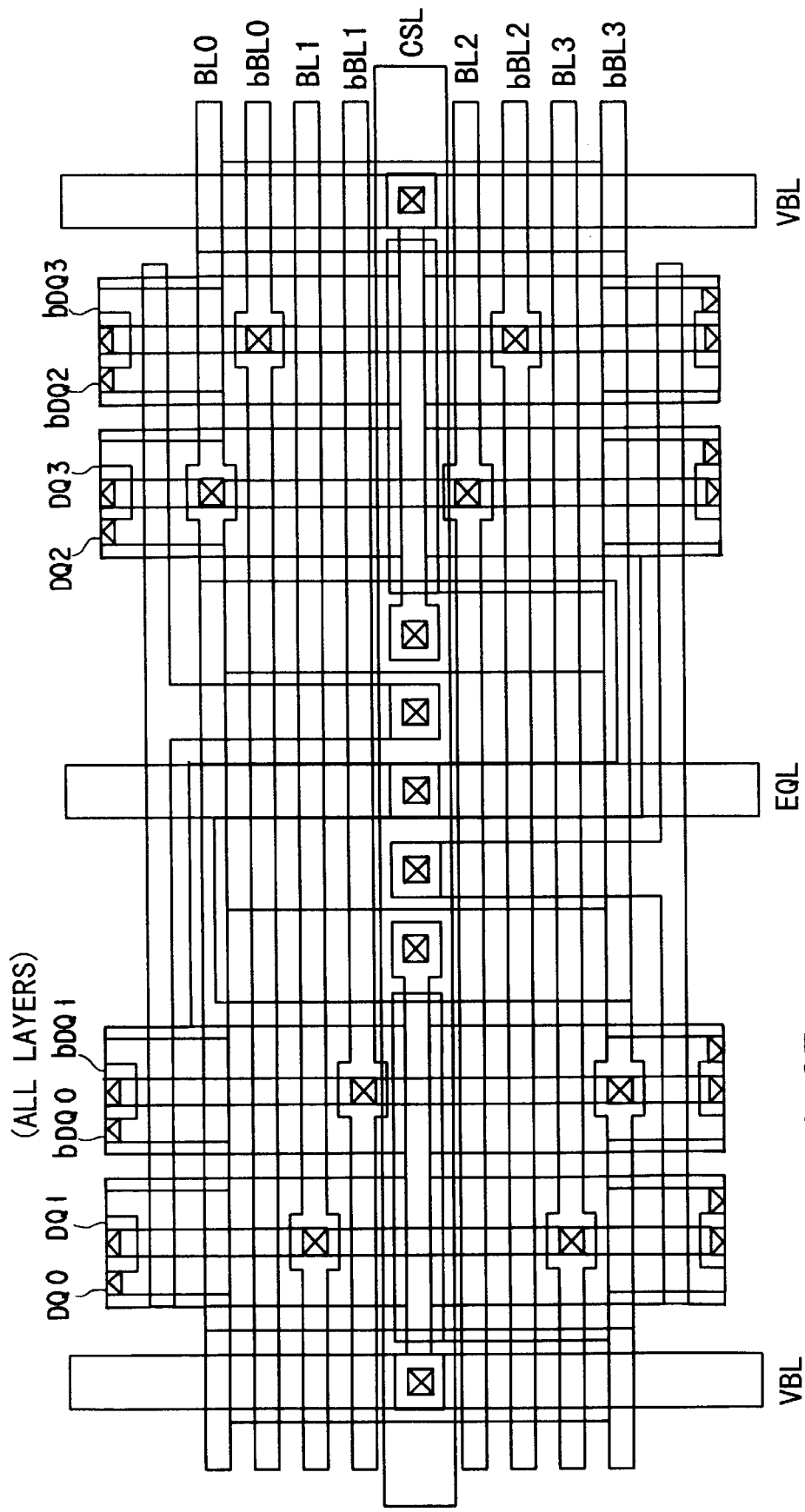
Figure 38:
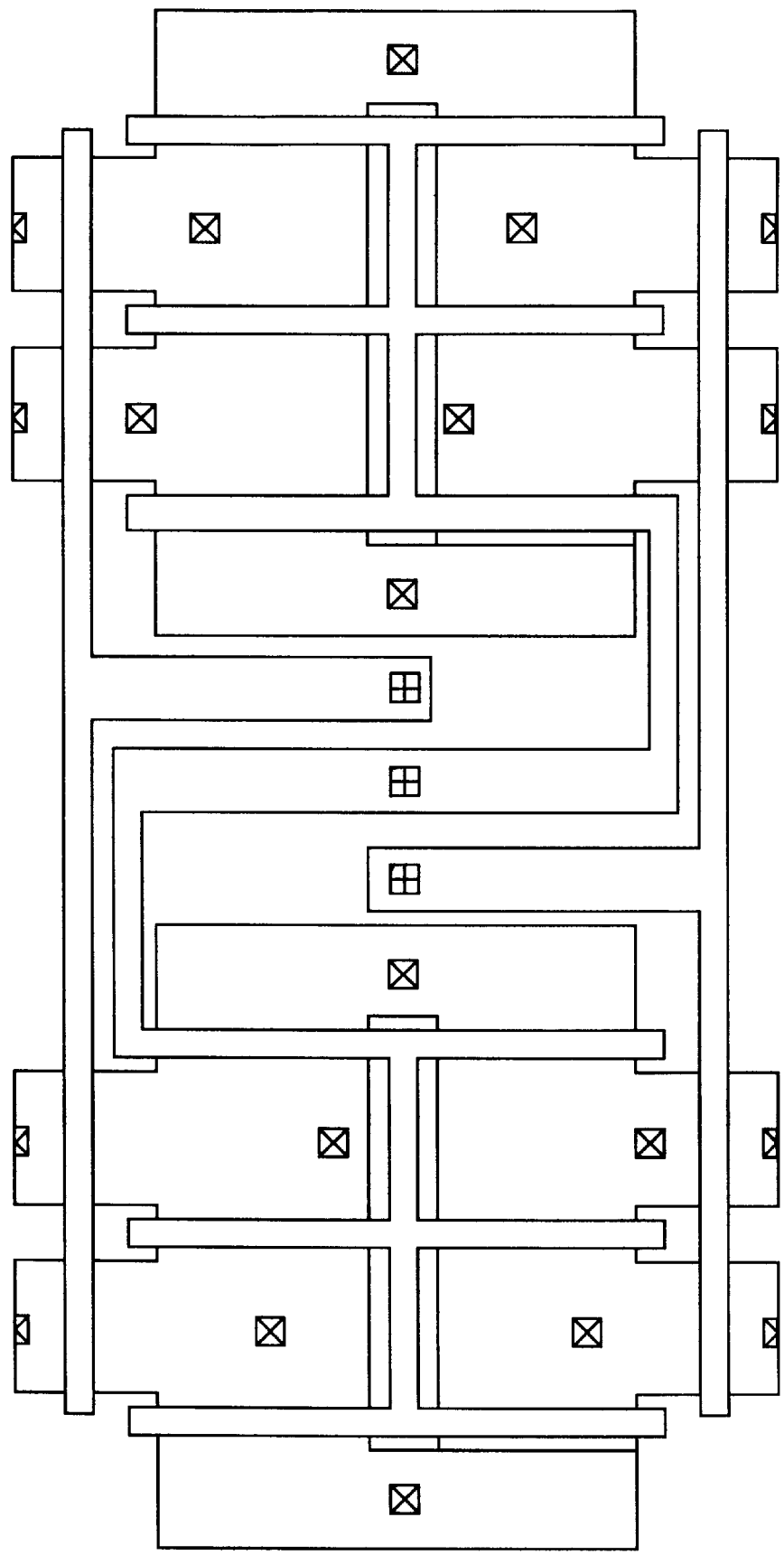
Figure 39:
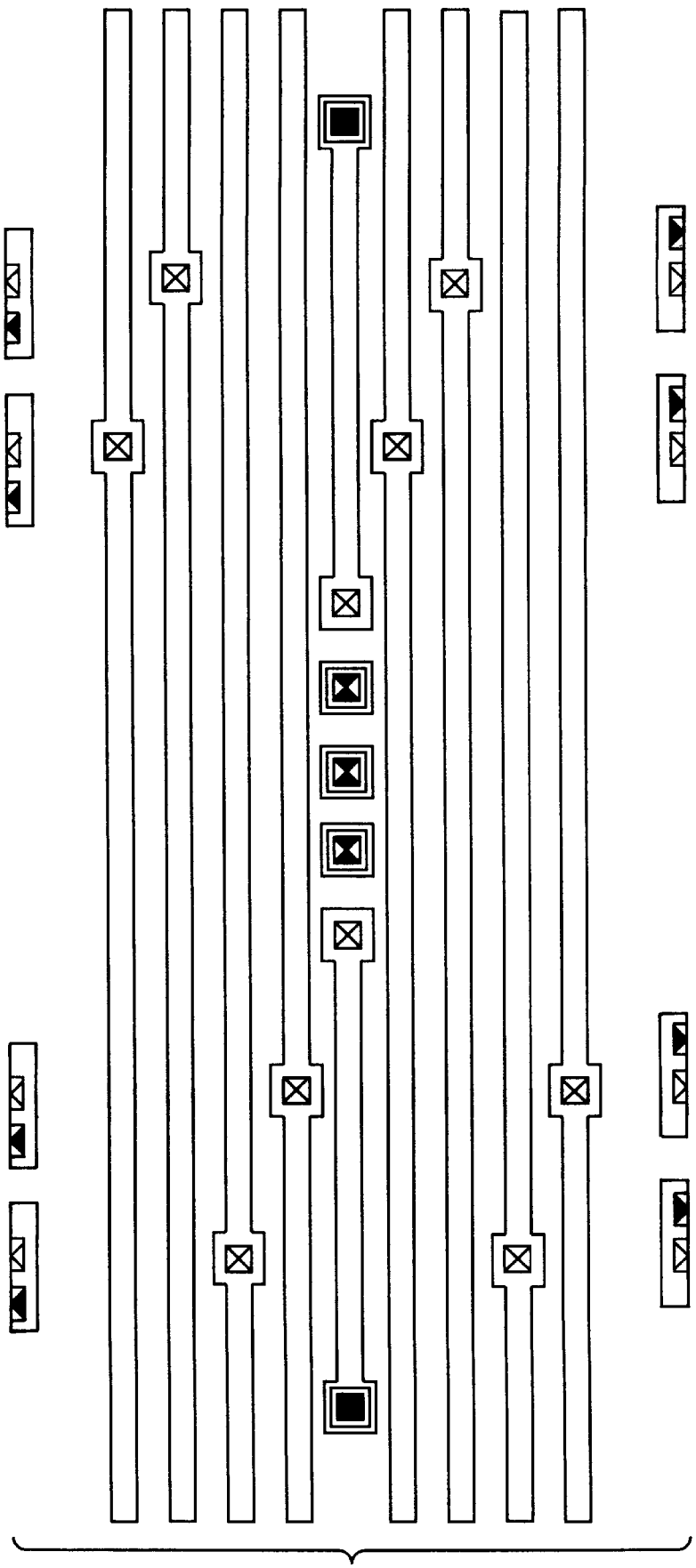
Figure 40:
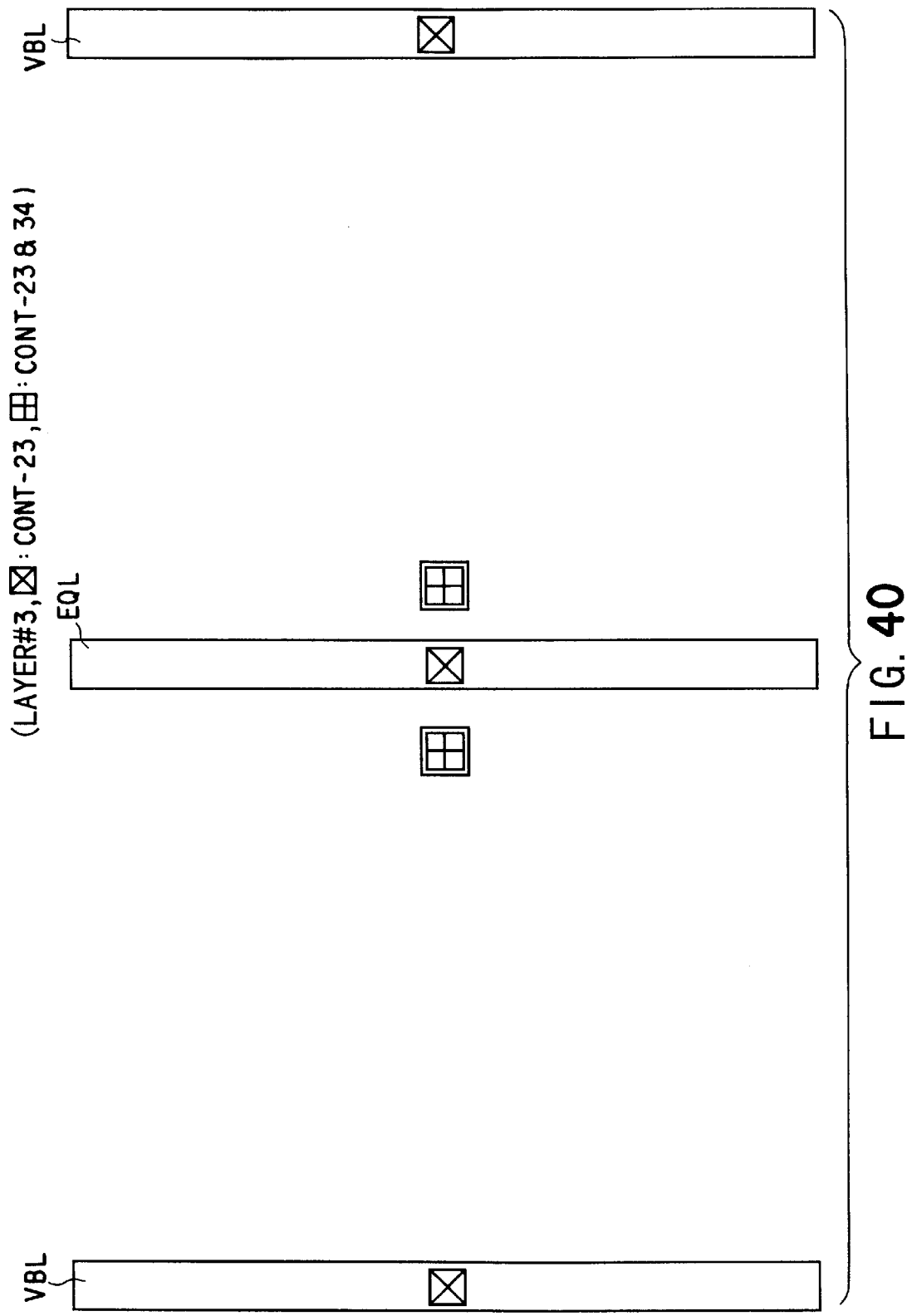
Figure 41:
Figure 42:
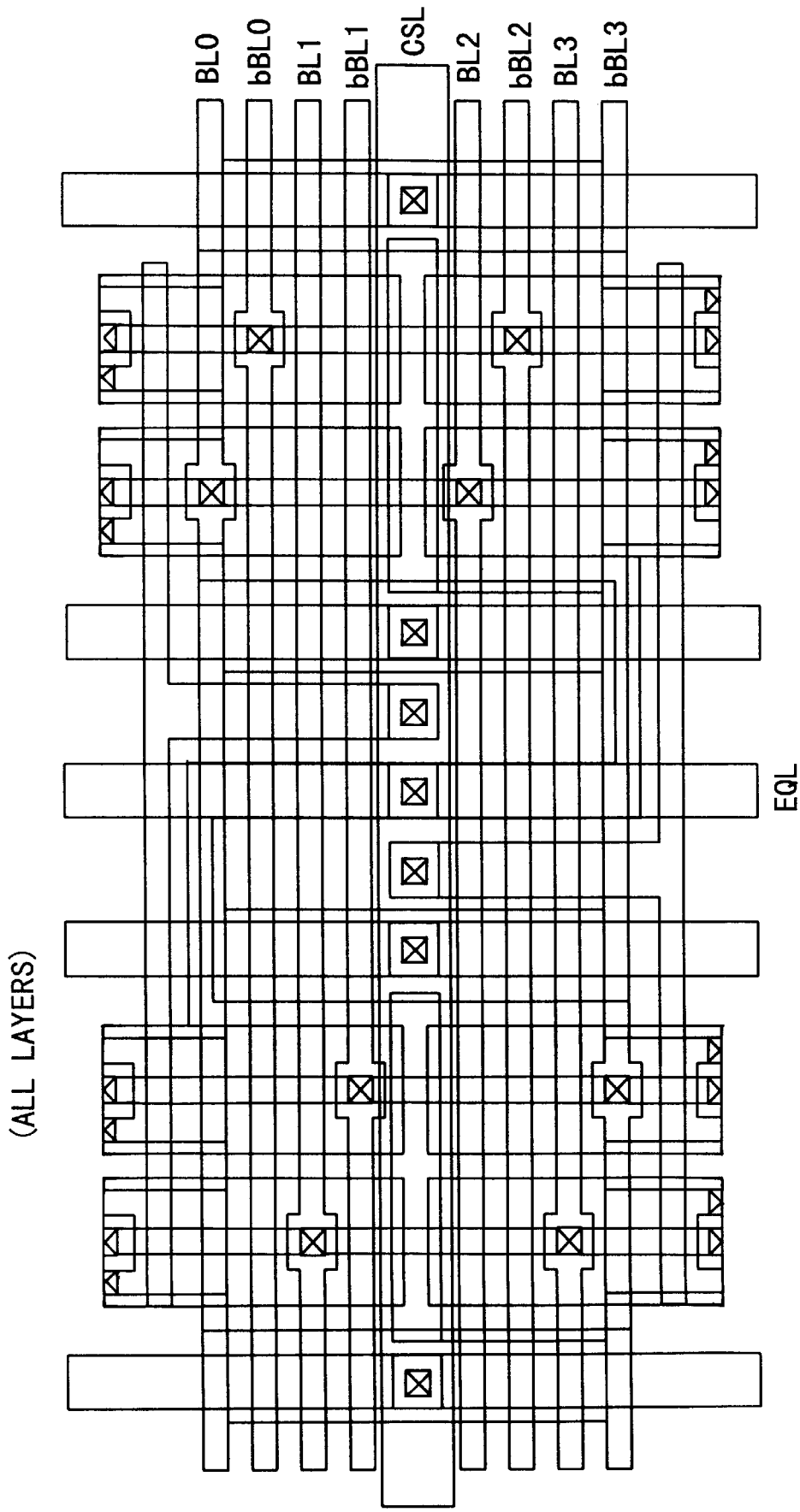
Figure 43:
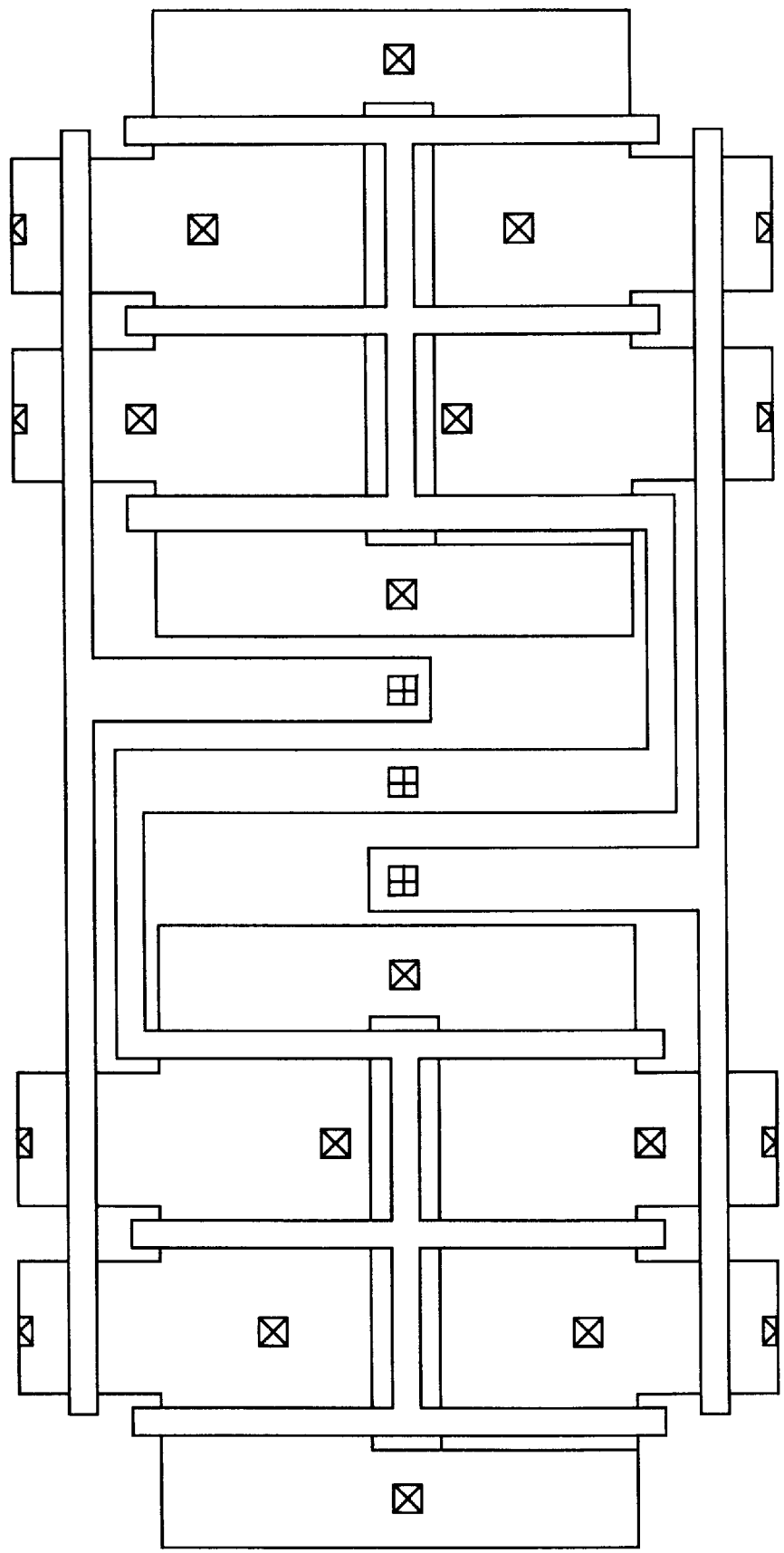
Figure 44:
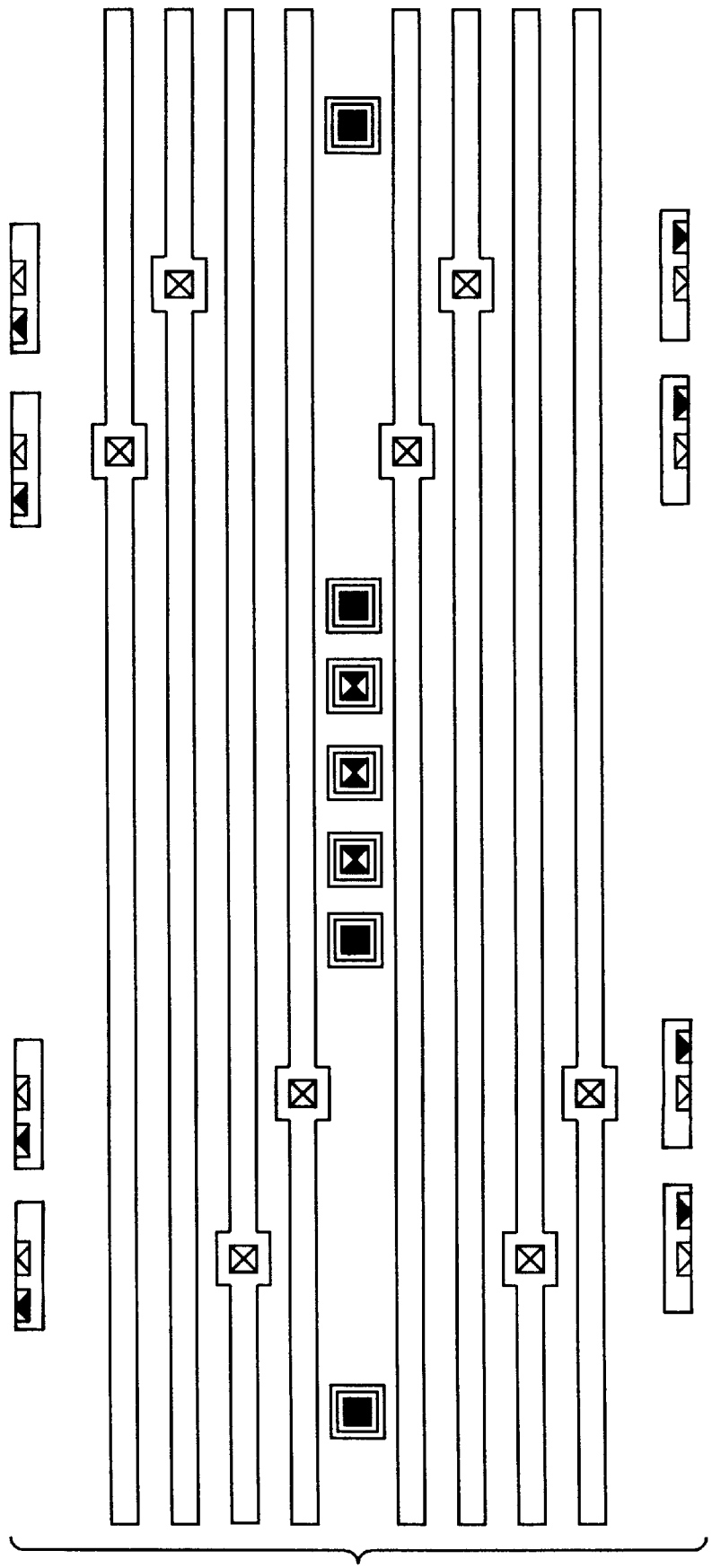
Figure 45:
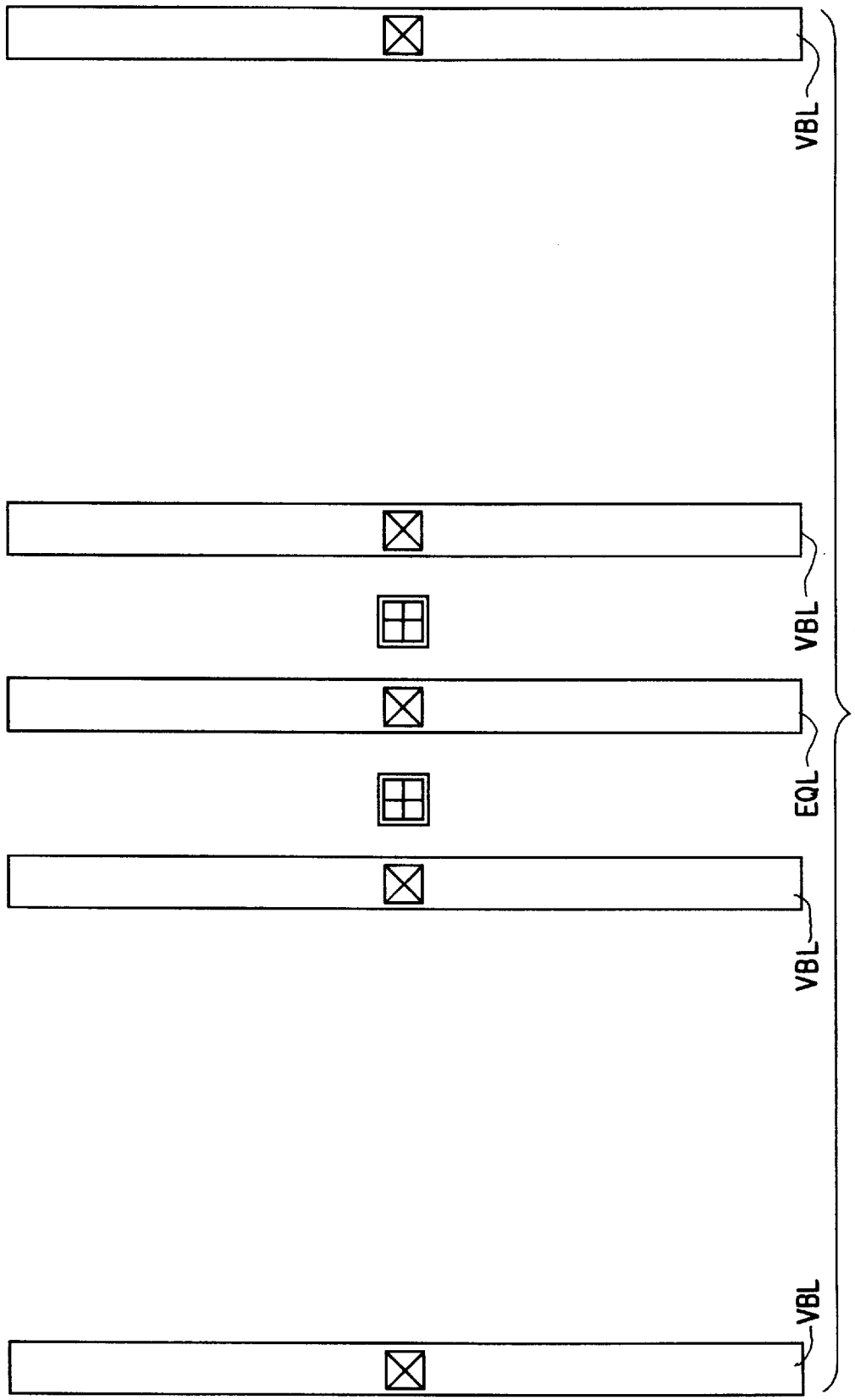

FIG. 12 a view showing an example of a second layout pattern according to an embodiment of the preset invention;

FIG. 13 is a view showing an element region, first wiring layer, and a contact for connecting the first wiring layer to a second wiring layer in the example of the second layout according to an embodiment of the present invention;

FIG. 14 is a view showing a second wiring layer, a contact for connecting the first wiring layer to the second wiring layer, and a contact for connecting the second wiring layer to a third wiring layer in the example of the second layout according to an embodiment of the present invention;

FIG. 15 is a view showing a third wiring layer, a contact for connecting the second wiring layer to the third wiring layer, and a contact for connecting the third wiring layer to a fourth wiring layer in the example of the second layout according to an embodiment of the present invention;

FIG. 16 is a view showing a fourth wiring layer, and a contact for connecting the third wiring layer to the fourth wiring layer in the example of the second layout according to an embodiment of the present invention;

FIG. 17 is a view showing an example of a third layout pattern according to an embodiment of the preset invention;

FIG. 18 is a view showing an element region, first wiring layer, and a contact for connecting the first wiring layer to a second wiring layer in the example of the third layout according to an embodiment of the present invention;

FIG. 19 is a view showing a second wiring layer, a contact for connecting the first wiring layer to the second wiring layer, and a contact for connecting the second wiring layer to a third wiring layer in the example of the third layout according to an embodiment of the present invention;

FIG. 20 is a view showing a third wiring layer, a contact for connecting the second wiring layer to the third wiring layer, and a contact for connecting the third wiring layer to a fourth wiring layer in the example of the third layout according to an embodiment of the present invention;

FIG. 21 is a view showing a fourth wiring layer, and a contact for connecting the third wiring layer to the fourth wiring layer in the example of the third layout according to an embodiment of the present invention;

FIG. 22 is a view showing an example of a fourth layout pattern according to an embodiment of the preset invention;

FIG. 23 is a view showing an element region, first wiring layer, and a contact for connecting the first wiring layer to a second wiring layer in the example of the fourth layout according to an embodiment of the present invention;

FIG. 24 is a view showing a second wiring layer, a contact for connecting the first wiring layer to the second wiring layer, and a contact for connecting the second wiring layer to a third wiring layer in the example of the fourth layout according to an embodiment of the present invention;

FIG. 25 is a view showing a third wiring layer, a contact for connecting the second wiring layer to the third wiring layer, and a contact for connecting the third wiring layer to a fourth wiring layer in the example of the fourth layout according to an embodiment of the present invention;

FIG. 26 is a view showing a fourth wiring layer, and a contact for connecting the third wiring layer to the fourth wiring layer in the example of the fourth layout according to an embodiment of the present invention;

FIG. 27 is a view showing an example of a fifth layout pattern according to an embodiment of the preset invention;

FIG. 28 is a view showing an element region, first wiring layer, and a contact for connecting the first wiring layer to a second wiring layer in the example of the fifth layout according to an embodiment of the present invention;

FIG. 29 is a view showing a second wiring layer, a contact for connecting the first wiring layer to the second wiring layer, and a contact for connecting the second wiring layer to a third wiring layer in the example of the fifth layout according to an embodiment of the present invention;

FIG. 30 is a view showing a third wiring layer, a contact for connecting the second wiring layer to the third wiring layer, and a contact for connecting the third wiring layer to a fourth wiring layer in the example of the fifth layout according to an embodiment of the present invention;

FIG. 31 a view showing a fourth wiring layer, and a contact or connecting the third wiring layer to the fourth wiring layer in the example of the fifth layout according to an embodiment of the present invention;

FIG. 32 is a view showing an example of a sixth layout pattern according to an embodiment of the preset invention;

FIG. 33 is a view showing an element region, first wiring layer, and a contact for connecting the first wiring layer to a second wiring layer in the example of the sixth layout according to an embodiment of the present invention;

FIG. 34 is a view showing a second wiring layer, a contact for connecting the first wiring layer to the second wiring layer, and a contact for connecting the second wiring layer to a third wiring layer in the example of the sixth layout according to an embodiment of the present invention;

FIG. 35 is a view showing a third wiring layer, a contact for connecting the second wiring layer to the third wiring layer, and a contact for connecting the third wiring layer to a fourth wiring layer in the example of the sixth layout according to an embodiment of the present invention;

FIG. 36 a view showing a fourth wiring layer, and a contact for connecting the third wiring layer to the fourth wiring layer in the example of the sixth layout according to an embodiment of the present invention;

FIG. 37 is a view showing an example of a seventh layout pattern according to an embodiment of the preset invention;

FIG. 38 is a view showing an element region, first wiring layer, and a contact for connecting the first wiring layer to a second wiring layer in the example of the seventh layout according to an embodiment of the present invention;

FIG. 39 is a view showing a second wiring layer, a contact for connecting the first wiring layer to the second wiring layer, and a contact for connecting the second wiring layer to a third wiring layer in the example of the seventh layout according to an embodiment of the present invention;

FIG. 40 is a view showing a third wiring layer, a contact for connecting the second wiring layer to the third wiring layer, and a contact for connecting the third wiring layer to a fourth wiring layer in the example of the seventh layout according to an embodiment of the present invention;

FIG. 41 is a view showing a fourth wiring layer, a contact for connecting the third wiring layer to the fourth wiring layer, and a contact for connecting the fourth wiring layer to a fifth wiring layer in the example of the seventh layout according to an embodiment of the present invention;

FIG. 42 is a view showing an example of a eighth layout pattern according to an embodiment of the preset invention;

FIG. 43 is a view showing an element region, first wiring layer, and a contact for connecting the first wiring layer to a second wiring layer in the example of the eighth layout according to an embodiment of the present invention;

FIG. 44 is a view showing a second wiring layer, a contact for connecting the first wiring layer to the second wiring layer, and a contact for connecting the second wiring layer to a third wiring layer in the example of the eighth layout according to an embodiment of the present invention;

FIG. 45 is a view showing a third wiring layer, a contact for connecting the second wiring layer to the third wiring layer, and a contact for connecting the third wiring layer to a fourth wiring layer in the example of the eighth layout according to an embodiment of the present invention; and FIG. 46 is a view showing a fourth wiring layer, and a contact for connecting the third wiring layer to the fourth wiring layer in the example of the eighth layout according to an embodiment of the present invention.

DETAILED DESCRIPTION OF THE INVENTION

Embodiments of the present invention will be described in reference to the accompanying drawings below.

Figure 1:
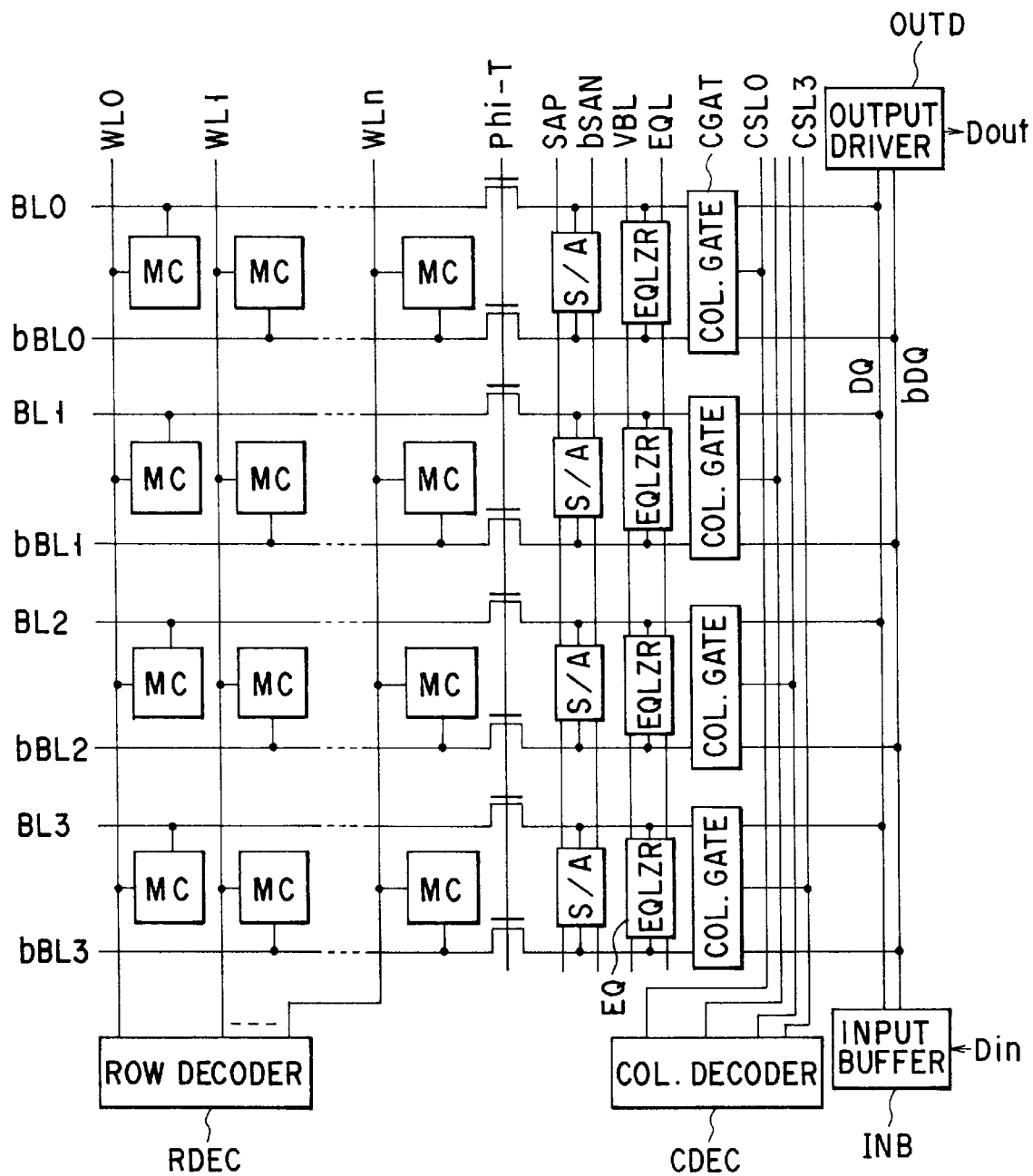
FIG. 1 is a view showing an outline of structure of a DRAM according to an embodiment of the present invention.
Figure 2:
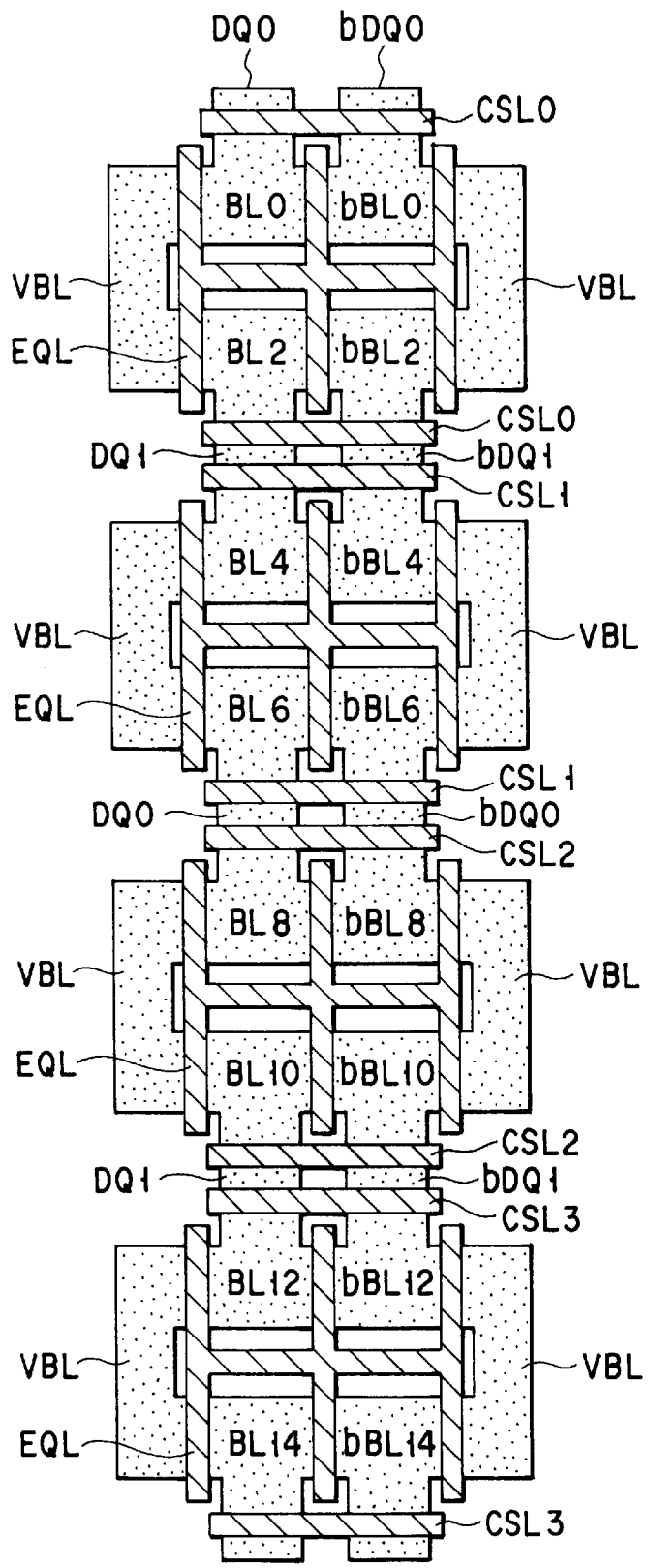
FIG. 2 is a view showing a layout of a transistor constituting a column gate and a bitline equalizer included in a sense amplifier section of a DRAM according to an embodiment of the present invention.
Figure 4:
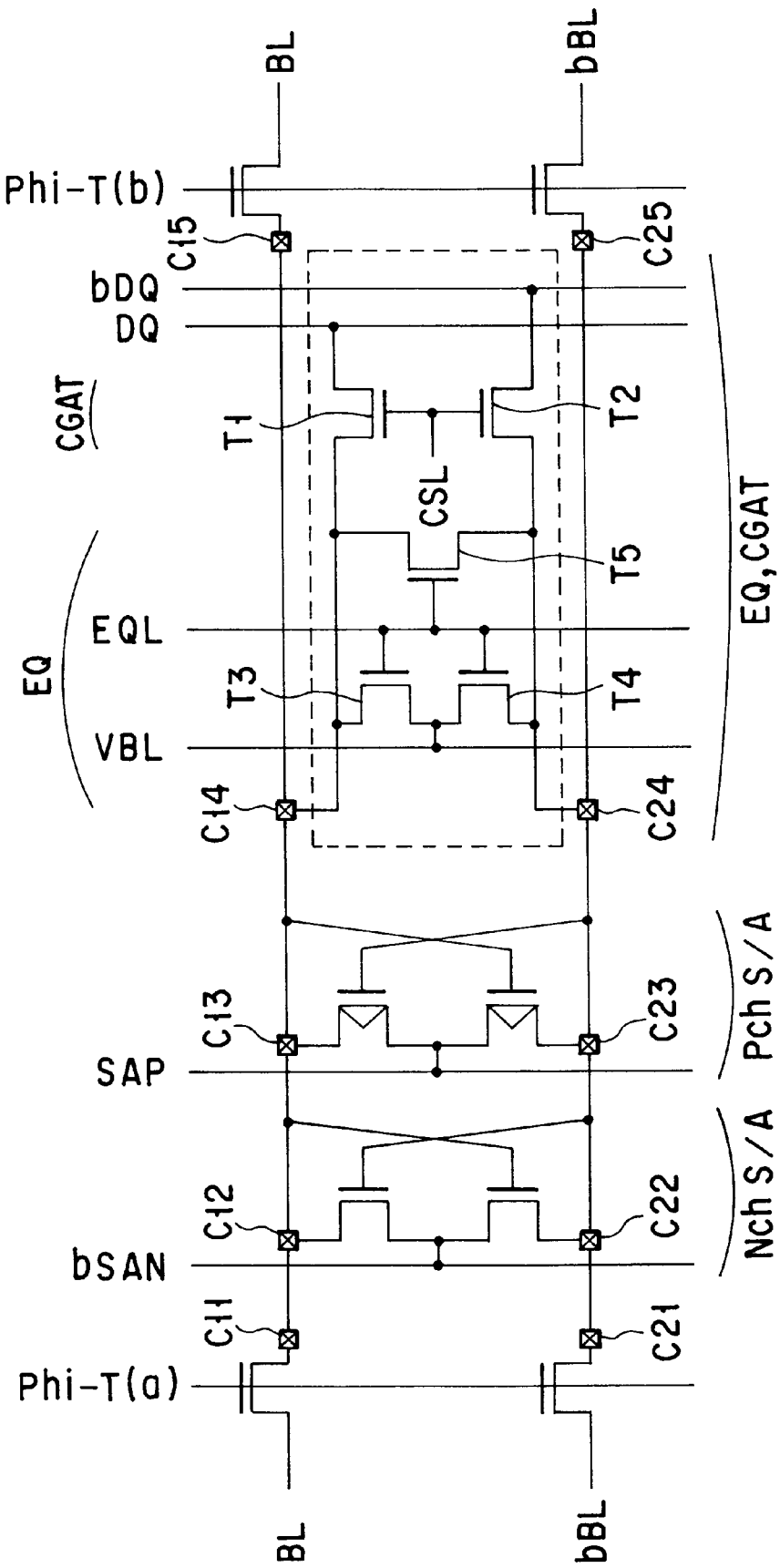
FIG. 4 is an equivalent circuit of a sense amplifier section according to an embodiment of the present invention.

A basic structure of an embodiment according to the present invention will be described in reference to FIGS. 1 to 4. FIG. 1 is a view showing an outline of structure of a DRAM according to an embodiment of the present invention. FIG. 2 is a view showing patterns of a column gate and a bitline equalizer included in a sense amplifier section of a DRAM. FIG. 3A is a view showing a part of the pattern of FIG. 2 and FIGS. 3B, 3C are respectively views showing structures in section taken along line 3B—3B and 3C—3C of FIG. 3A. FIG. 4 is an equivalent circuit of a sense amplifier section.

In FIG. 1, an MC indicates a memory cell, an S/A indicates a sense amplifier, an EQ indicates a bitline equalizer, a CGAT indicates a column gate, an OUTD indicates an output driver, an INB indicates an input buffer, a RDEC indicates a row decoder, a CDEC indicates a column decoder, BL0 to BL3 indicate bitlines, bBL0 to bBL3 indicate bitlines, each of which constitutes pairs with the BL0 to BL3 bitlines, WL0 to WLn indicate wordlines, a Phi-T indicates a transfer gate control line, SAP and bSAN indicate sense amplifier drive lines, a VBL indicates a precharge voltage supply line, an EQL indicates a bitline equalizer control line, CSL0 to CSL3 indicate column gate select lines, a DQ indicates a data line, a bDQ indicates a data line which constitutes a pair with DQ, a Din indicates an input terminal, and a Dout indicates an output terminal. In the other figures, the constituents same as or corresponding to those described above are respectively indicated by the same reference symbols.

In FIGS. 3A to 3B, G1 to G10 indicate gate electrodes, S1 to S10 indicate diffusion regions constituting source or drain and N1 to N4 indicate common nodes. Gate electrodes G1, G2, G6 and G7 are connected to a column gate select line CSL0 and gate electrodes G3, G4, G5, G8, G9 and G10 are connected to a bitline equalizer control line EQL. Diffusion regions S1, S3, S7 and S9 are respectively connected to data lines DQ0, bDQ0, DQ1 and bDQ1, diffusion regions S2, S4, S8 and S10 are respectively connected to bitlines BL0, bBL0, BL2 and bBL2, and diffusion regions S5, S6 are connected to a precharge voltage supply line VBL. FIG. 2 shows a constitution, wherein a plurality of combinations of a column gate and an equalizer shown in FIG. 3 are connected in series, and a diffusion region of the equalizer is shared by a column gate adjacent to the equalizer. Descriptions on the constituents are omitted since they can be easily inferred from the drawings in FIGS. 3A to 3B.

In FIG. 4, MOS transistors T1 and T2 constitute a column gate CGAT and MOS transistors T3, T4 and T5 constitute a bitline equalizer EQ. FIG. 4 shows contacts C11 to C15 between a bitline BL and each of the diffusion regions of transistors included in a sense amplifier section and contacts C21 to C25 between a bitline bBL and each of the diffusion regions of transistors included in the sense amplifier section.

In the embodiment, as characteristically shown in FIG. 2 and FIGS. 3A to 3C, there is formed a composite element pattern constructed by merging element patterns of a column gate and an equalizer. An example shown in FIGS. 3A to 3C will be described. A transistor having a gate G1 (a transistor constituting a column gate), a transistor having a gate G3 (a transistor constituting a bitline equalizer), and a transistor having a gate G5 (a transistor constituting a bitline equalizer), in common, have a diffusion region S2 which works as a common node N1. In a similar manner, common nodes N2, N3 and N4 are respectively shared by a transistor constituting a column gate and two transistors constituting a bitline equalizer. Besides, the common nodes N1, N2, N3 and N4 (diffusion regions S2, S4, S8 and S10) are respectively connected to bitlines BL0, bBL0 and bitlines BL1, bBL1.

In such a manner, since a transistor constituting a column gate and a transistor constituting a bitline equalizer share a diffusion region, one bitline contact can be shared by the column gate and the bitline equalizer, whereas conventionally bitline contacts have respectively been provided to the column gate and the bitline equalizer. Therefore, with respect to a column gate and a bitline equalizer, the number of bitline contacts can be decreased to a half as compared to a conventional technique.

Figure 5:
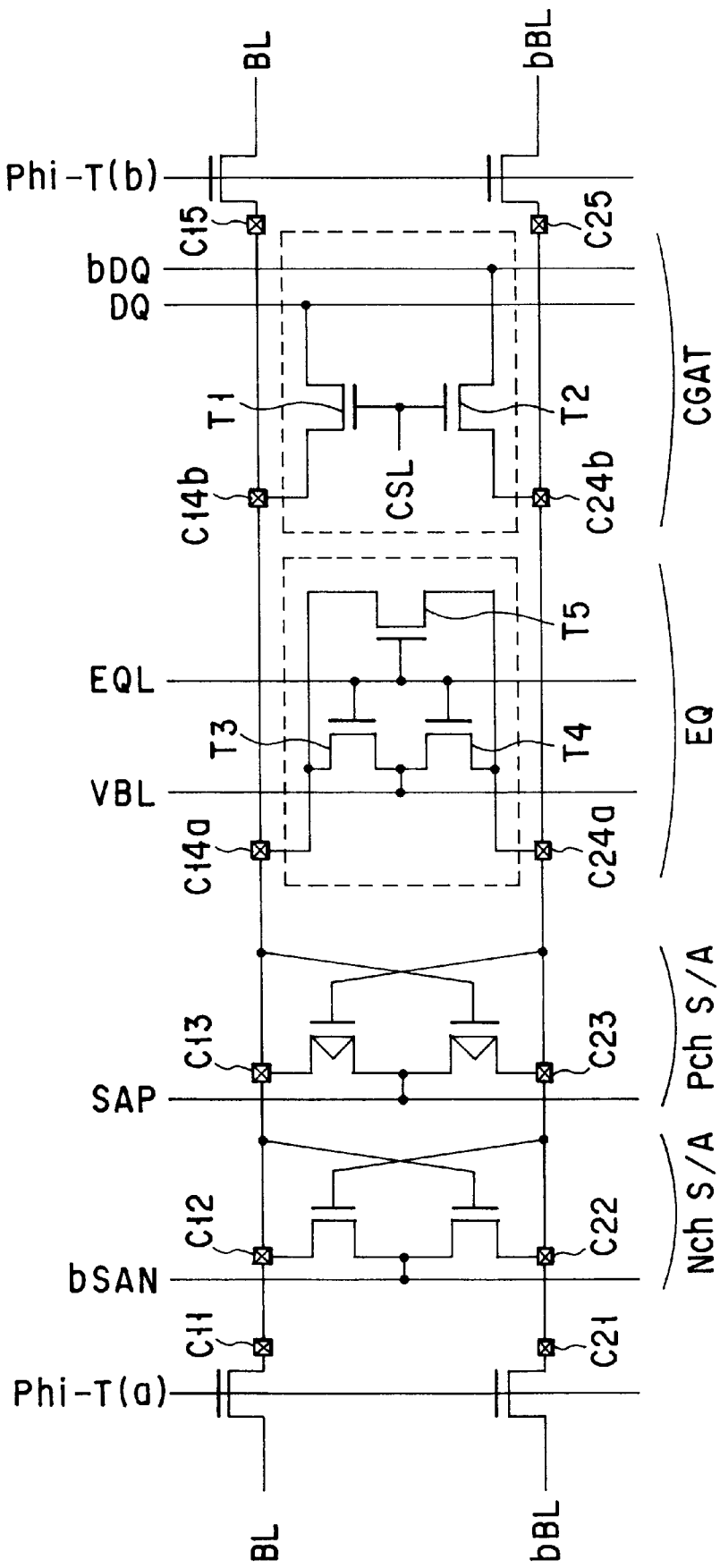
FIG. 5 is an equivalent circuit showing an example of a sense amplifier section in a conventional technique.

FIG. 4 shows the above mentioned circumstances by use of a circuit and as shown in the figure, a column gate CGAT and a bitline equalizer EQ share a bitline contact (C14 for a bitline BL and C24 for a bitline bBL). FIG. 5 is an equivalent circuit of a conventional sense amplifier section. Conventionally, since a column gate CGAT and a bitline equalizer EQ have separately disposed, different bitline contacts (C14a and C14b for a bitline BL, and C24a and C24b for a bitline bBL) are respectively required for a column gate CGAT and a bitline equalizer EQ. In the whole of the sense amplifier of the embodiment, the number of bitline contacts is reduced to five-sixth as compared with a conventional constitution.

As described above, in the present invention, since one diffusion region is shared by a transistor constituting a column gate and a transistor constituting a bitline equalizer, one bitline contact can be shared by the column gate and the bitline equalizer, so that the number of bitline contacts in a sense amplifier section can be reduced. Therefore, a bitline capacitance in a sense amplifier section can be decreased, and a high speed operation and low power consumption in a sense operation can be realized.

Conventionally, since gate widths of transistors T3, T4 connecting VBL of a bitline equalizer and bitlines BL, bBL therebetween cannot be large in layout, drivability of a transistor have been unable to be sufficiently secured. In the embodiment, since gate widths of the transistors T3, T4 can be broadened to the same as a gate width of a transistor T5 which connects bitlines of a bitline equalizer therebetween, drivability of the transistors T3, T4 can sufficiently be secured and thereby a high speed operation in equalizing operation can be realized.

Then, examples of layout patterns obtained on the basis of the structure shown by the basic embodiment above will be described in a concrete manner.

In each of the following examples of layout patterns, "layer#n" indicates a nth layer ("layer#0 means a lowest level layer (0th layer), "layer#4" means an uppermost level layer (a 4th layer)) and "cont-xy" indicates a contact from "layer#y" to "layer#x."

Figure 6:
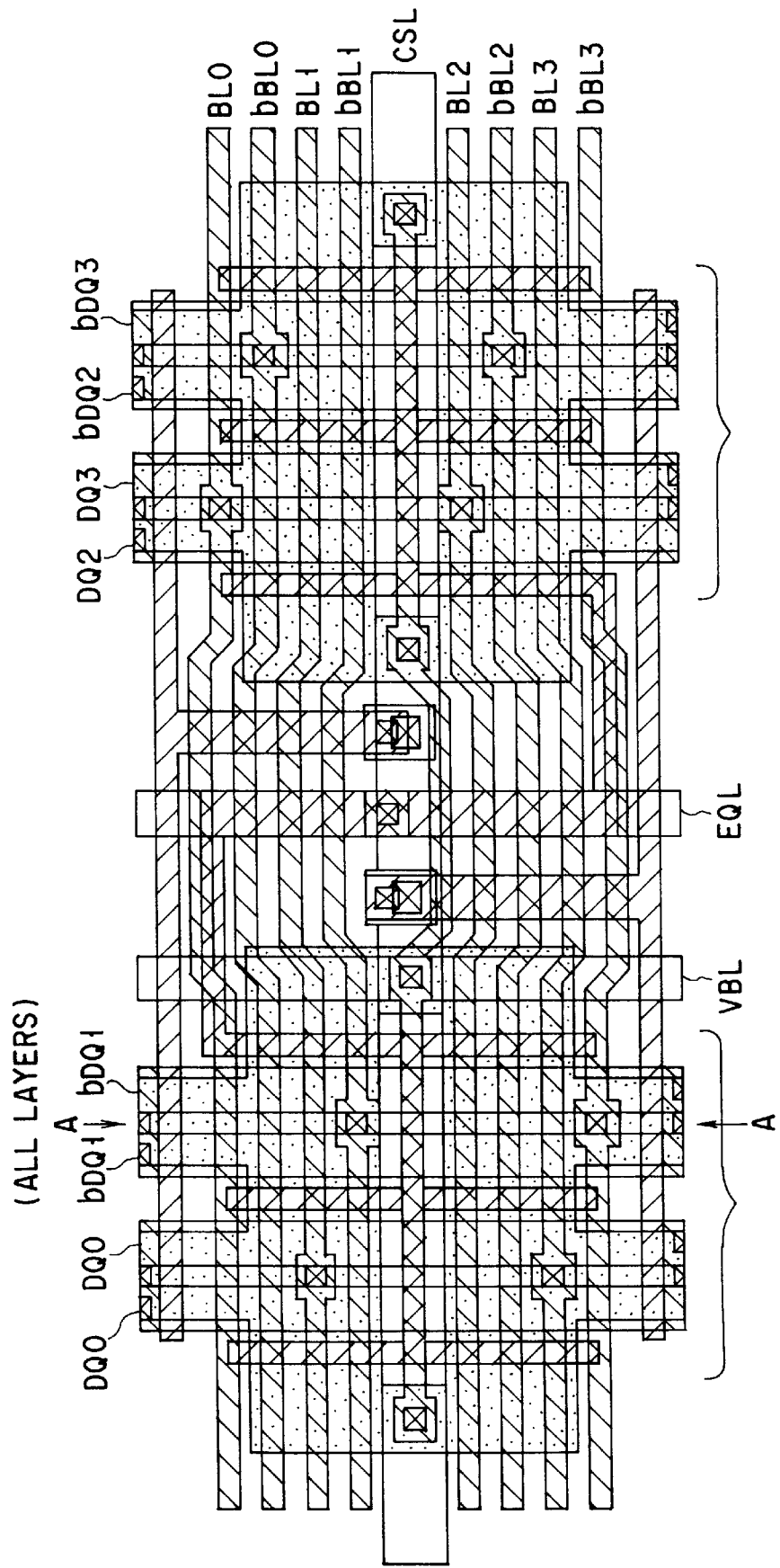
FIG. 6 is a view showing an example of a first layout pattern according to an embodiment of the preset invention.
Figure 7:
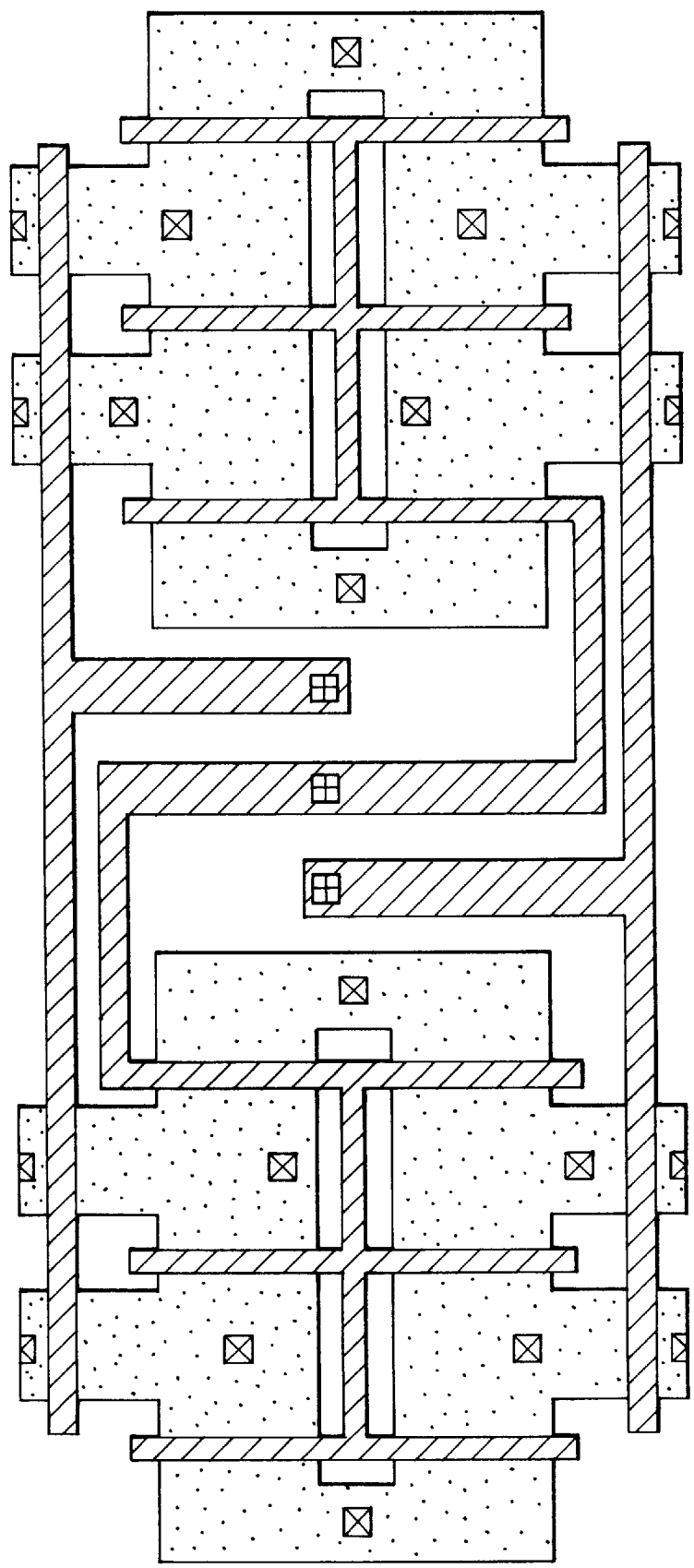
FIG. 7 is a view showing an element region, first wiring layer, and a contact for connecting the first wiring layer to a second wiring layer in the example of the first layout according to an embodiment of the present invention.
Figure 8:
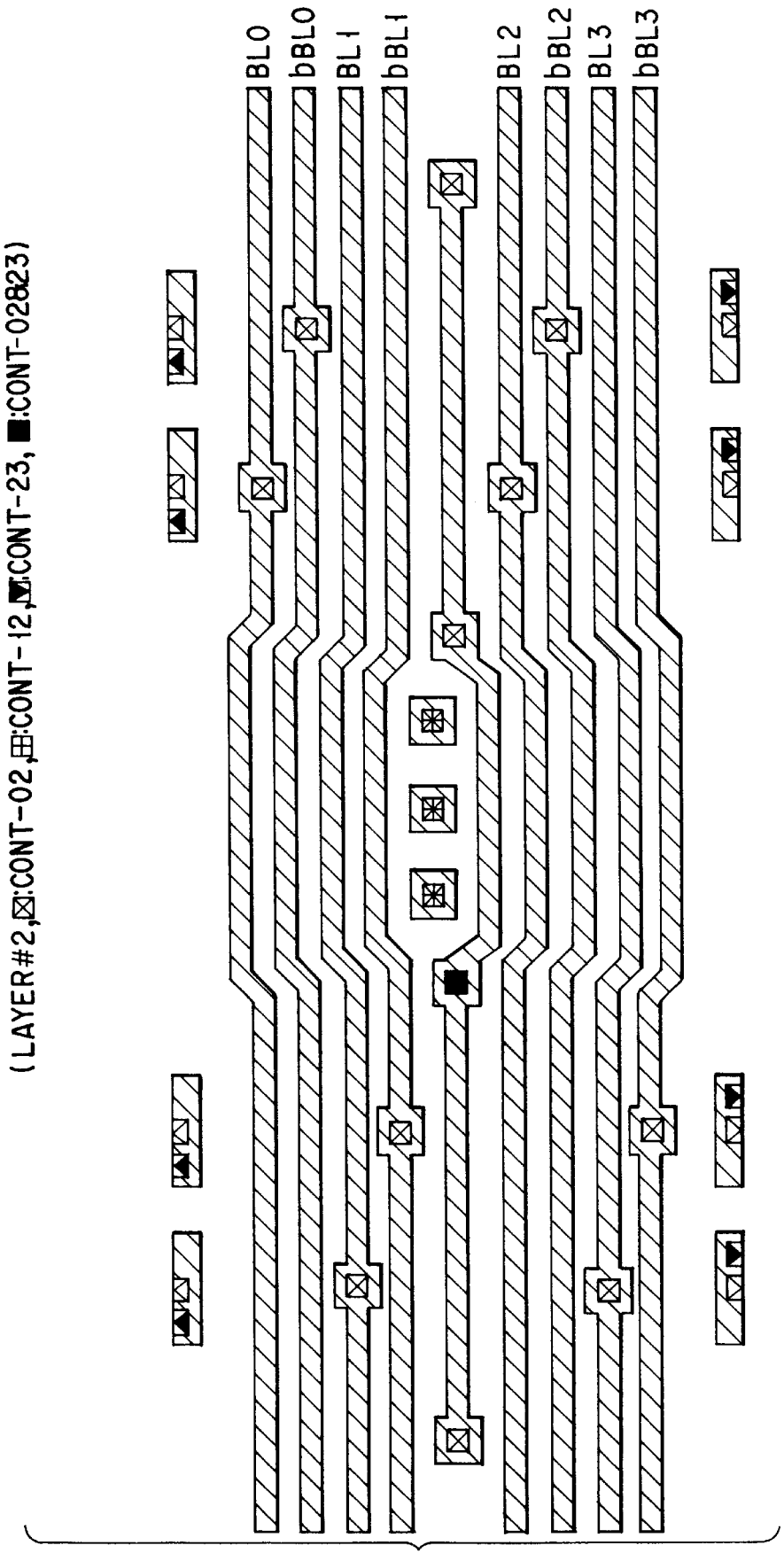
FIG. 8 is a view showing a second wiring layer, a contact for connecting the first wiring layer to the second wiring layer, and a contact for connecting the second wiring layer to a third wiring layer in the example of the first layout according to an embodiment of the present invention.

The example of the first layout pattern will be described in reference to FIGS. 6 to 10. FIG. 6 shows all the layers and all the contacts of a layout example, FIG. 7 shows layer#0, layer#1, cont-02 and cont-12, FIG. 8 shows layer#2, cont-02, cont-12 and cont-23, FIG. 9 shows layer#3, cont-23 and cont-34 and FIG. 10 shows layer#4 and cont-34.

In the example of the layout pattern (other examples of the layout patterns are similar to the example of the layout pattern), there is shown the case where when one column select line CSL is activated, information from four pairs of bitlines is output to four pairs of DQ lines. In the example of the layout pattern (other examples of the layout patterns are similar to the example of the layout pattern), left and right regions of FIG. 6 as viewed (regions indicated by "{" in FIG. 6) comprises a pattern like a pattern shown in FIGS. 3A to 3C formed therein (see a pattern shown in FIG. 7). In FIG. 6, along a direction of a DQ line, the same patterns are formed and two patterns are formed in symmetry with respect a boundary line (a boundary line means a line intersecting a DQ line or the like on the figure and other examples of the layout patterns are similar to the example of the layout pattern in this regard).

Figure 11:
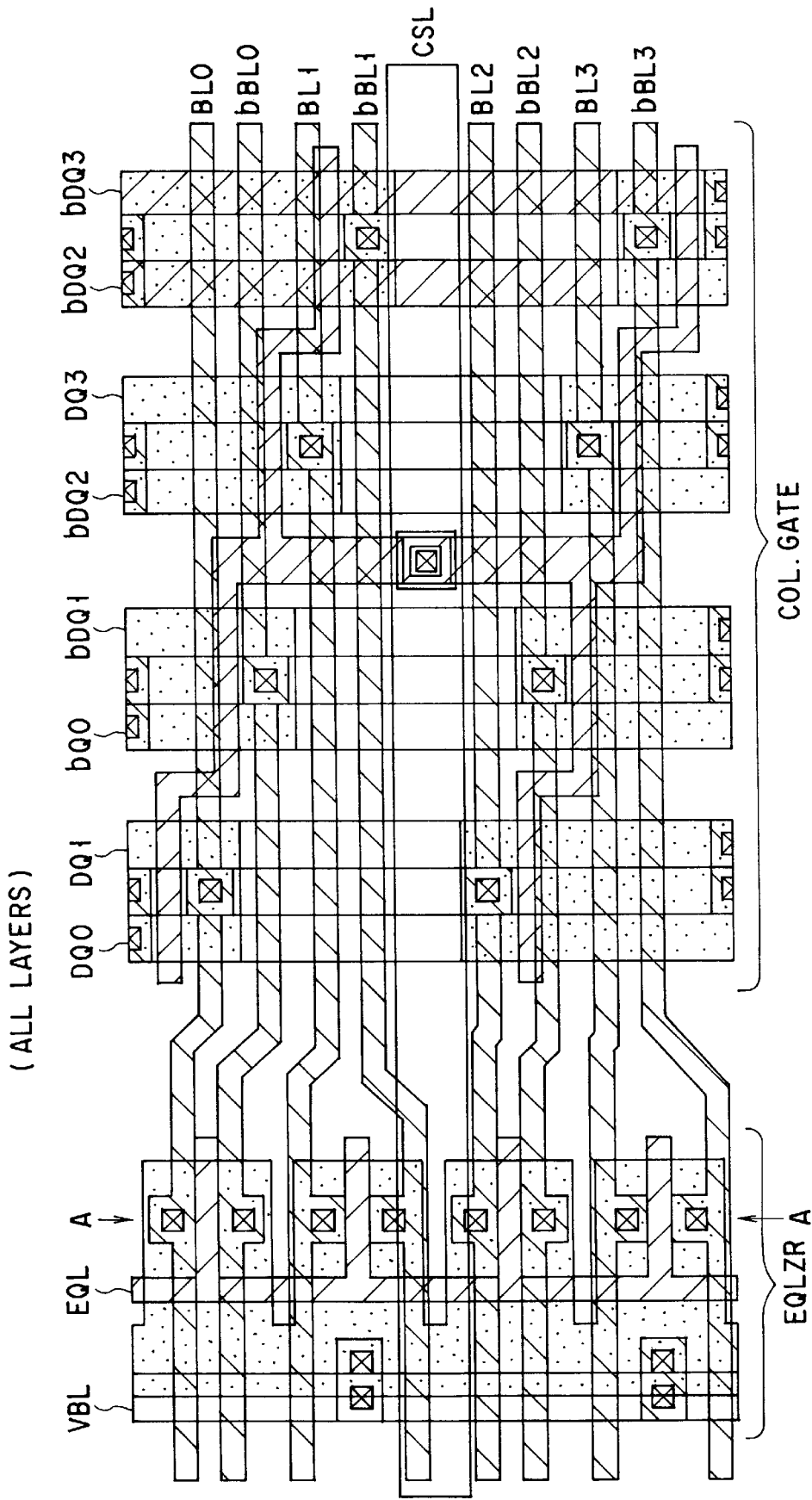
FIG. 11 is a view showing a layout example according to an conventional technique.

Here, a wiring margin of a bitline will be considered. In the case where a example of the layout pattern as shown in FIG. 11 is assumed as a conventional example of a layout pattern, the severest wiring margin of a bitline is shown in a portion A—A of FIG. 11. On the other hand, in FIG. 6, the severest wiring margin of a bitline is shown in a portion A—A of FIG. 6. Here, the minimum line width of a bitline is L, the minimum space between adjacent bitlines is S and the minimum width of a bitline contact is C, and it is assumed that a space between a bitline contact and a channel of a transistor is equal to a positioning margin between a bitline and bitline contact.

In a conventional example shown in FIG. 11, in the case where four equalizers are disposed, a width requirement for forming a bitline is expressed by [8C+8S]. In the example shown in FIG. 6, the width requirement is expressed as [3C+17S]. For example, if it is assumed that C=0.5 $\mu$m, L=0.25 $\mu$m and S=0.25 $\mu$m, a width requirement for forming a bitline when four equalizers are disposed is 6 $\mu$m in a conventional example shown in FIG. 11, whereas a width requirement is 5.75 $\mu$m in the example shown in FIG. 6.

In such a manner, in the present invention, a space between adjacent bitlines can be broader than in a conventional technique and a wiring margin of a bitline can be improved.

In the conventional example shown in FIG. 11, patterns of a column gate and an equalizer are separately disposed in different regions. In contrast to this, in the present invention, as shown in FIG. 6, since element patterns of a column gate and a bitline equalizer are merged (i.e., formed in the same element region), an area for a sense amplifier section can be reduced.

In the embodiment, a bitline equalizer control line EQL is formed between element regions provided in the left and right sides of FIG. 6 (other examples of the layout patterns are similar to the example of the layout pattern in this regard). Therefore, a gate wiring up to each transistor can be shortened, which contributes to a high speed operation.

The example in which gate electrodes of adjacent equalizers are commonly connected is shown in FIG. 6, in addition to this, gate electrodes of column gates may be commonly connected.

The example of the second layout pattern will be described in reference to FIGS. 12 to 16. FIG. 12 shows all the layers and all the contacts of a example of the layout pattern, FIG. 13 shows layer#0, layer#1, cont-02 and cont-12, FIG. 14 layer#2, cont-02, cont-12 and cont-23, FIG. 15 layer#3, cont-23 and cont-34 and FIG. 16 layer#4 and cont-34.

In the example, wirings to a column gate are disposed on the both sides of the column gate and a bitline equalizer and a bitline equalizer control line EQL is disposed in the center so as to penetrate through a plurality of columns. Thereby, bitline wiring in the middle to a column gate and a bitline equalizer is simplified.

The third layout example will be described in reference to FIGS. 17 to 21. FIG. 17 shows all the layers and all the contacts of a layout example, FIG. 18 shows layer#0, layer#1, cont-02 and cont-12, FIG. 19 layer#2, cont-02, cont-12 and cont-23, FIG. 20 layer#3, cont-23 and cont-34 and FIG. 21 layer#4 and cont-34.

In the example, as is in the example of the second layout pattern, wirings to a column gate are disposed on the both sides of the column gate and a bitline equalizer and a bitline equalizer control line EQL is disposed in the center so as to penetrate through a plurality of columns. What is different from the example of the second layout pattern is that wirings to a column gate are formed by use of a wiring in an upper layer than a bitline on both sides of a column gate and an equalizer and thus occupancy areas of a column gate and an bitline equalizer along a bitline direction are decreased.

The example of the fourth layout pattern will be described in reference to FIGS. 22 to 26. FIG. 22 shows all the layers and all the contacts of a layout example, FIG. 23 shows layer#0, layer#1, cont-02, and cont-12, FIG. 24 shows layer#2, cont-02, cont-12 and cont-23, FIG. 25 shows layer#3, cont-23 and cont-34 and FIG. 26 shows layer#4 and cont-34.

In the example, wirings to a column gate are disposed on the both sides of a column gate and a bitline equalizer and the column gate and the bitline equalizer, which are disposed separately, leftward and rightward, in the examples of the first to third layout patterns, are connected to each other in a diffusion region. Thereby, a contact of a precharge voltage supply line VBL can be large in area. Besides, occupancy areas of a column gate and a bitline equalizer along a bitline direction can be decreased.

The example of the fifth layout pattern will be described in reference to FIGS. 27 to 31. FIG. 27 shows all the layers and all the contacts of a layout example, FIG. 28 shows layer#0, layer#1, cont-02, and cont-12, FIG. 29 shows layer#2, cont-02, cont-12 and cont-23, FIG. 30 shows layer#3, cont-23 and cont-34 and FIG. 31 shows layer#4 and cont-34.

In the example of the fourth layout pattern, wirings are formed by use of a wiring in an upper layer than a bitline on both sides of a column gate and a bitline equalizer and occupancy areas of the column gate and the bitline equalizer along a bitline direction are decreased.

An example of a sixth layout pattern is shown in FIGS. 32 to 36, an example of a seventh layout pattern is shown in FIGS. 37 to 41, and an example of an eighth layout pattern is shown in FIGS. 42 to 46, respectively.

In the example of the sixth layout pattern, two precharge voltage supply line VBL are prepared and disposed between adjacent patterns.

In the example of the seventh layout pattern, two precharge voltage supply line VBL are disposed outside of adjacent patterns.

In the example of the eighth layout pattern, four precharge voltage supply line VBL are prepared.

While the embodiment of the present invention has in detail described, the present invention is not limited to the embodiment but the embodiment can be modified or changed in various ways without departing from the spirit and the scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. The semiconductor memory device comprising:

a semiconductor substrate; and a plurality of element regions formed in said semiconductor substrate, wherein
at least one column gate having a first transistor with diffusion layers and at least one equalizer having a second transistor with diffusion layers are formed as a set in one element region of said plurality of element regions, and
one of said diffusion layers of said first transistor and one of said diffusion layers of said second transistor are shared.

2. The semiconductor memory device according to claim 1, wherein at least two sets of said column gate and said equalizer are formed in one element region and a set of said column gate and said equalizer shares a diffusion layer with an adjacent set of said column gate and said equalizer.

3. The semiconductor memory device according to claim 1, wherein a gate electrode of said equalizer is disposed so as to divide a diffusion layer region into six regions.

4. The semiconductor memory device according to claim 1, wherein
said column gate comprises:
a first transistor, a gate of the first transistor being connected to a column gate select line, one of a source and a drain of the first transistor being connected to a first data line and the other being connected to a first bitline; and
a second transistor, a gate of the second transistor being connected to the column gate select line, one of a source and a drain of the second transistor being connected to a second data line and the other being connected to a second bitline, and
said equalizer comprises:
a third transistor a gate of the third transistor being connected to an equalizer control line one of a source and a drain of the third transistor being connected to the first bitline and the other being connected to an equalizer voltage supply line;
a fourth transistor, a gate of the fourth transistor being connected to the equalizer control line, one of a source and a drain of the fourth transistor being connected to the second bitline and the other being connected to the equalizer voltage supply line; and
a fifth transistor, a gate of the fifth transistor being connected to the equalizer control line, one of a source and a drain of the fifth transistor being connected to the first bitline and the other being connected to the second bitline,
wherein the other of a source and drain of the first transistor, one of a source and drain of the third transistor and one of a source and drain of the fifth transistor are connected to the first bitline through a common contact and the other of a source and drain of the second transistor, one of a source and drain of the fourth transistor and the other of a source and drain of the fifth transistor are connected to the second bitline through a common contact.

5. The semiconductor memory device according to claim 1, wherein:
said column gate comprises first and second column gates;
said equalizer comprises first and second equalizers;
said first column gate comprises first and second transistors;
said first equalizer comprises: a third transistor having a first common node in common owned by the first transistor; a fourth transistor having a second common node in common owned by the second transistor; and a fifth transistor having the first and second common nodes;
said second column gate comprises sixth and seventh transistors;
said second equalizer comprises:
an eighth transistor having a third common node in common owned by the sixth transistor;
a ninth transistor having a fourth common node in common owned by the seventh transistor; and
a tenth transistor having the third and fourth common nodes.

6. The semiconductor memory device according to claim 5, wherein a first set and a second set of said column gate and said equalizer is disposed parallel to a bitline.

7. The semiconductor memory device according to claim 6, wherein a equalizer control line is disposed normal to said bitline, and said equalizer control line is made of an upper wiring layer than a wiring layer of the bitline.

8. The semiconductor memory device according to claim 7, wherein at least one bitline precharge voltage supply line is disposed between the first set and the second set disposed in an adjacent manner, the bitline precharge voltage supply line is disposed normal to the bitline, and the bitline precharge voltage supply line is made of an upper wiring layer than a wiring layer of the bitline.

9. The semiconductor memory device according to claim 7, wherein at least two bitline precharge voltage supply lines are disposed normal to the bitline.

10. The semiconductor memory device according to claim 9, wherein at least one bitline precharge voltage supply line is disposed at both ends of the first and second sets, which are disposed in an adjacent manner, in a direction parallel to the bitline.

11. The semiconductor memory device according to claim 9, wherein at least one bitline precharge voltage supply line is disposed at both ends of each of the first and second sets, which are disposed in an adjacent manner, in a direction parallel to the bitline.

12. The semiconductor memory device according to claim 6, wherein gate electrodes of the equalizers included in a first set and a second set disposed in an adjacent manner are connected to by a common gate wiring.

13. The semiconductor memory device according to claim 5, wherein said one element region comprises the first and second sets of the column gate and the equalizer formed therein in an adjacent manner, wherein diffusion layers of the first and second transistors of the first column gate of the first set are shared by diffusion layers of the sixth and seventh transistors of the second column of the second set.

14. The semiconductor memory device according to claim 13, wherein the shared diffusion layer is provided with a contact and the gate electrode of the column gate is disposed so as to surround the equalizer.

15. The semiconductor memory device according to claim 13, wherein a first set and a second set of said column gate and said equalizer is disposed parallel to a bitline.

16. The semiconductor memory device according to claim 15, wherein a equalizer control line is disposed normal to said bitline, and said equalizer control line is made of an upper wiring layer than a wiring layer of the bitline.

17. The semiconductor memory device according to claim 16, wherein at least one bitline precharge voltage supply line is disposed between the first set and the second set disposed in an adjacent manner, the bitline precharge voltage supply line is disposed normal to the bitline, and the bitline precharge voltage supply line is made of an upper wiring layer than a wiring layer of the bitline.

18. The semiconductor memory device according to claim 16, wherein at least two bitline precharge voltage supply lines are disposed normal to the bitline.

19. The semiconductor memory device according to claim 18, wherein at least one bitline precharge voltage supply line is disposed at both ends of the first and second sets, which are disposed in an adjacent manner, in a direction parallel to the bitline.

20. The semiconductor memory device according to claim 18, wherein at least one bitline precharge voltage supply line is disposed at both ends of each of the first and second sets, which are disposed in an adjacent manner, in a direction parallel to the bitline.

21. The semiconductor memory device according to claim 15, wherein gate electrodes of the equalizers included in a first set and a second set disposed in an adjacent manner are connected to by a common gate wiring.

22. The semiconductor memory device according to claim 5, wherein:

said first transistor comprises: a first diffusion region; a second diffusion region, which constitutes the second common node; and a first gate electrode, which is provided between the first and second diffusion regions;

said second transistor comprises: a third diffusion region; a fourth diffusion region, which constitutes the second common node; a second gate electrode, which is provided between the third and fourth diffusion regions;

said third transistor comprises: the second diffusion region; a fifth diffusion region; a third gate electrode, which is provided between the second and fifth diffusion regions;

said fourth transistor comprises: the fourth diffusion region; a sixth diffusion region; a fourth gate electrode, which is provided between the fourth and six diffusion regions;

said fifth transistor comprises: the second diffusion region; the fourth diffusion region; a fifth gate electrode, which is provided between the second and fourth diffusion regions;

said sixth transistor comprises: a seventh diffusion region; a eighth diffusion region, which constitutes the third node; a sixth gate electrode, which is provided between the seventh and eighth diffusion regions;

said seventh transistor comprises: a ninth diffusion region; a tenth diffusion region, which constitutes the fourth node; a seventh gate electrode, which is provided between the ninth and tenth diffusion regions;

said eighth transistor comprises: the fifth diffusion region; the eighth diffusion region; a eighth gate electrode, which is provided between the fifth and eighth diffusion regions;

said ninth transistor comprises: the sixth diffusion region; the tenth diffusion region; a ninth gate electrode, which is provided between the sixth and tenth diffusion regions; and said tenth transistor comprises: the eighth diffusion region; the tenth diffusion region; a tenth gate electrode, which is provided between the eighth and tenth diffusion regions.

23. The semiconductor memory device according to claim 22, wherein the first diffusion region is connected to a first data line, the second diffusion region is connected to a first bitline, the third diffusion region is connected to a second data line, the fourth diffusion region is connected to a second bitline, the fifth and sixth diffusion regions are connected to an equalizer voltage supply line, the seventh diffusion region is connected to a third data line, the eighth diffusion region is connected to a third bitline, the ninth diffusion region is connected to a fourth data line and the tenth diffusion region is connected to a fourth bitline, and the first, second, sixth and seventh gate electrodes are connected to a column gate select line and the third, fourth, fifth, eighth, ninth and tenth gate electrodes are connected to a equalizer control line.

24. The semiconductor memory device according to claim 23, wherein a potential of the equalizer voltage supply line is a precharge potential of a bitline.

25. The semiconductor memory device according to claim 5, wherein at least two equalizers are formed in one element region, further comprising an equalizer control line connected to each gate electrode of the third to fifth and eighth to tenth transistors of the two equalizers formed in one element region.

26. The semiconductor memory device according to claim 25, wherein at least two column gates are formed in one element region and the first to fourth column gates of the adjacent two column gates are connected to a common control line.

27. The semiconductor memory device according to claim 5, wherein at least two column gates are formed in one element region and the first to fourth column gates of the adjacent two column gates are connected to a common control line.

28. A semiconductor memory device comprising:

a semiconductor substrate;

at least one element region formed in said semiconductor substrate;

a bitline formed above said semiconductor substrate;

at least one column gate comprising a first transistor having a gate and two diffusion layers formed on said at least one element region;

at least one equalizer comprising a second transistor having a gate and two diffusion layers formed on said at least one element region, wherein one of said diffusion layers of said first transistor and one of said diffusion layers of said second transistor are shared;

a contact which connects said bitline with the shared diffusion layer.

29. A semiconductor memory device comprising:

a semiconductor substrate;

an element region formed in said semiconductor substrate;

first and second data lines formed above said semiconductor substrate;

a first select gate comprising a first transistor having a first gate electrode and two diffusion layers formed on said element region, one of said two diffusion layers of said first transistor being connected to said first data line;

a second select gate comprising a second transistor having a second gate electrode and two diffusion layers formed on said element region, one of said two diffusion layers of said second transistor being connected to said second data line;

a data line equalizer which comprises: a third transistor having a third gate electrode and two diffusion layers formed on said element region, one of said two diffusion layers of said third transistor and other of said two diffusion layers of said first transistor are shared, other of said two diffusion layers of said third transistor being connected to a predetermined potential supply line; a fourth transistor having a fourth gate electrode and two diffusion layers formed on said element region, one of said two diffusion layers of said fourth transistor and other of said two diffusion layers of said second transistor are shared, other of said two diffusion layers of said fourth transistor being connected to said predetermined potential supply line; and a fifth transistor having a fifth gate electrode and two diffusion layers formed on said element region, one of said two diffusion layers of said fifth transistor and other of said two diffusion layers of said first transistor are shared, other of said two diffusion layers of said fifth transistor and other of said two diffusion layers of said second transistor are shared, wherein said first gate electrode and said second gate electrode being composed of same wiring layer, said third gate electrode, said fourth gate electrode and said fifth gate electrode being composed of same wiring layer.

30. The semiconductor memory device according to claim 29, wherein said third, fourth, and fifth gate electrodes connected with a data line equalizer control line.

31. The semiconductor memory device according to claim 30, wherein said data line equalizer control line is provided above said first gate electrode.

32. The semiconductor memory device according to claim 29, wherein said first and second gate electrodes connected with a data select line.

33. The semiconductor memory device according to claim 32, wherein said data select line is provided above said second gate electrode.

* * * * *